US009877389B2

(12) United States Patent
Yoo et al.

(10) Patent No.: US 9,877,389 B2
(45) Date of Patent: Jan. 23, 2018

(54) MOBILE TERMINAL

(71) Applicant: LG ELECTRONICS INC., Seoul (KR)

(72) Inventors: Kyungsu Yoo, Seoul (KR); Bohyoung Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 157 days.

(21) Appl. No.: 14/928,410

(22) Filed: Oct. 30, 2015

(65) Prior Publication Data

US 2016/0128217 A1    May 5, 2016

(30) Foreign Application Priority Data

Nov. 4, 2014    (KR) .................... 10-2014-0152132

(51) Int. Cl.
*H05K 1/11*    (2006.01)
*H04M 1/02*    (2006.01)
(Continued)

(52) U.S. Cl.
CPC ............ *H05K 1/11* (2013.01); *H04M 1/0254* (2013.01); *H04M 1/0274* (2013.01);
(Continued)

(58) Field of Classification Search
CPC . H05K 5/00; H05K 1/11; H05K 3/365; H05K 1/182; H05K 2201/2009; H05K 2201/053; H05K 1/118; H05K 2201/10189; H05K 2201/10037; G06F 1/16; G06F 1/1601; G06F 1/1626; G06F 1/1622; H04M 1/0214; H04M 1/23; H04M 1/0277; H04M 1/0254; H04M 1/0274; H01H 13/7013
(Continued)

(56) References Cited

U.S. PATENT DOCUMENTS

| 4,092,527 A | * | 5/1978 | Luecke | ................. G06F 3/0238 |
| | | | | 200/5 A |
| 5,049,863 A | * | 9/1991 | Oka | ...................... G06F 3/0202 |
| | | | | 345/163 |

(Continued)

FOREIGN PATENT DOCUMENTS

| KR | 200244605 Y1 | 10/2001 |
| KR | 200299989 Y1 | 1/2003 |

(Continued)

OTHER PUBLICATIONS

Internet Search Result (http://itespresso.net/80211353799) on Nov. 7, 2015, "Google Project Ara, DIY Smartphone era?"; Apr. 17, 2014.

*Primary Examiner* — Steven T Sawyer
*Assistant Examiner* — Sagar Shrestha
(74) *Attorney, Agent, or Firm* — Dentons US LLP

(57) ABSTRACT

Disclosed is a mobile terminal including a terminal body; a first module detachable from a back surface of the terminal body; and a printed circuit board, wherein the back surface of the terminal body includes a first recess to receive the first module, and wherein the first module includes a contact terminal configured to contact the printed circuit board through a connector having one or more electrode regions such that the first module is electrically connected to the printed circuit board when the first module is received in the first recess.

18 Claims, 26 Drawing Sheets

(51) Int. Cl.
*H05K 3/36* (2006.01)
*H05K 1/18* (2006.01)
*H01H 13/70* (2006.01)

(52) U.S. Cl.
CPC .......... *H04M 1/0277* (2013.01); *H05K 3/365* (2013.01); *H01H 13/7013* (2013.01); *H05K 1/118* (2013.01); *H05K 1/182* (2013.01); *H05K 2201/053* (2013.01); *H05K 2201/10037* (2013.01); *H05K 2201/10189* (2013.01); *H05K 2201/2009* (2013.01)

(58) Field of Classification Search
USPC ............ 361/679.01, 679.02, 679.04, 679.05, 361/679.06, 679.21, 679.26, 679.3, 361/679.55, 679.56; 455/550.1, 455/575.1–575.8
See application file for complete search history.

(56) References Cited

U.S. PATENT DOCUMENTS

| | | | | |
|---|---|---|---|---|
| 5,865,546 | A * | 2/1999 | Ganthier | G06F 3/0202 341/22 |
| 6,922,333 | B2 * | 7/2005 | Weng | G06F 1/1616 220/230 |
| 2003/0068986 | A1 | 4/2003 | Oh | B60R 11/0241 455/90.1 |
| 2004/0198307 | A1 * | 10/2004 | Chang | H04M 1/0235 455/348 |
| 2004/0242264 | A1 * | 12/2004 | Cho | H04M 1/6066 455/550.1 |
| 2005/0192064 | A1 * | 9/2005 | Thomas | H04M 1/0283 455/575.1 |
| 2008/0093208 | A1 * | 4/2008 | Seo | G06F 3/0338 200/406 |
| 2008/0150769 | A1 * | 6/2008 | Imamura | G06F 1/1616 341/34 |
| 2009/0021899 | A1 * | 1/2009 | Chen | H04M 1/0247 361/679.09 |
| 2009/0057121 | A1 * | 3/2009 | Yoshida | H01H 13/704 200/5 A |
| 2010/0208434 | A1 * | 8/2010 | Kim | G06F 1/1626 361/729 |
| 2010/0212938 | A1 * | 8/2010 | Nakamura | H05K 1/0281 174/254 |
| 2011/0115744 | A1 * | 5/2011 | Murayama | G06F 3/0414 345/174 |
| 2011/0186414 | A1 * | 8/2011 | Kim | H01H 1/10 200/512 |
| 2011/0304223 | A1 * | 12/2011 | Togashi | H01O 1/243 307/116 |
| 2012/0231646 | A1 * | 9/2012 | Nakano | H01R 12/79 439/267 |
| 2012/0327611 | A1 * | 12/2012 | Liang | G06F 1/1616 361/747 |
| 2013/0058039 | A1 * | 3/2013 | Lee | H04M 1/0202 361/690 |
| 2013/0156233 | A1 * | 6/2013 | Joo | H04M 1/0266 381/151 |
| 2014/0076704 | A1 * | 3/2014 | Los | H01H 13/807 200/513 |
| 2014/0118960 | A1 * | 5/2014 | Cheng | H05K 7/06 361/730 |
| 2014/0270303 | A1 * | 9/2014 | Cheng | G06F 1/1626 381/333 |
| 2016/0007504 | A1 * | 1/2016 | Wu | G06F 1/203 361/700 |

FOREIGN PATENT DOCUMENTS

| | | |
|---|---|---|
| KR | 1020080056966 A | 6/2008 |
| KR | 1020080066336 A | 7/2008 |
| KR | 1020100050031 A | 5/2010 |
| KR | 1020130001649 A | 1/2013 |

* cited by examiner

MOBILE TERMINAL

CROSS-REFERENCE TO RELATED APPLICATION

Pursuant to 35 U.S.C. § 119(a), this application claims the benefit of earlier filing date and rights of priority to Korean Application No. 10-2014-0152132, filed on Nov. 4, 2014 the contents of which is incorporated by reference herein in its entirety.

BACKGROUND OF THE INVENTION

1. Field of the Invention

The present invention relates to a mobile terminal having a replaceable module for a user's convenience.

2. Background of the Invention

In general, a terminal may be classified into a mobile (portable) terminal and a stationary terminal according to a moveable state. The mobile terminal may be also classified into a handheld terminal and a vehicle mount terminal according to a user's carriage method.

As functions of the terminal become more diversified, the terminal can support more complicated functions such as capturing images or video, reproducing music or video files, playing games, receiving broadcast signals, and the like. By comprehensively and collectively implementing such functions, the mobile terminal may be embodied in the form of a multimedia player or a device.

Various attempts have been made to implement complicated functions in such a multimedia device by means of hardware or software.

A camera module, a back side input module, and so on are disposed on a back surface of a mobile terminal, and the modules are fixed to the mobile terminal and thus cannot be replaced with modules having various functions according to characteristics of use by a user. Also, when a mobile terminal is assembled, it is difficult to assemble the display at a front side because of an electrical connection problem between the display and the printed circuit board.

Furthermore, many screws are used in assembling a terminal, thereby increasing an assembly time. When a screw is exposed from the outer appearance surface, this adversely affects a sense of beauty. Since a single substrate is used, a thickness of the terminal is great.

SUMMARY OF THE INVENTION

Therefore, an aspect of the detailed description is to provide a solution for these or other problems. The present invention also provides a mobile terminal having a back surface to or from which various modules may be attached or detached.

Furthermore, the present invention provides a structure in which a display is assembled at a front side and provides a solution to reduce a thickness of a mobile terminal having a single substrate structure.

To achieve these and other advantages and in accordance with the purpose of this specification, as embodied and broadly described herein, there is provided a mobile terminal including a terminal body; a first module detachable from a back surface of the terminal body; and a printed circuit board, wherein the back surface of the terminal body includes a first recess to receive the first module, and wherein the first module includes a contact terminal configured to contact the printed circuit board through a connector having one or more electrode regions such that the first module is electrically connected to the printed circuit board when the first module is received in the first recess.

The mobile terminal may further include a second module and a third module detachable from the back surface of the terminal body, wherein the rear surface of the terminal body includes a second recess to receive the second module and a third recess to receive the third module, wherein the second recess is located to one side of the first recess and the third recess is located to another side of the first recess.

The first module may further comprise: a first button configured to receive a push input for a first function; a second button configured to receive a push input for a second function; a flexible printed circuit board including a plurality of contact terminals; and a dome switch located between the flexible printed circuit board and the first and second buttons, the dome switch configured to transfer a push input received from the first button or the second button to at least one of the plurality of contact terminals such that the at least one contact terminal makes contact with the printed circuit board through the connector.

The connector may be disposed in the first recess.

The first module may further comprise one or more magnetic members, and wherein one or more first metallic members may be disposed in the first recess in locations corresponding to the one or more magnetic members when the first module is received in the first recess.

The first module may include a protrusion through a side surface of the first recess, and wherein the terminal body may further include a cover configured for selectively covering the protrusion and maintaining the first module in the first recess when the cover is covering the protrusion.

The cover may include an outer surface, and wherein the outer surface may include a plurality of slip-resistant formations.

The mobile terminal may further include an elastic member associated with a side surface of the first recess, wherein the first module may further comprise a side surface that includes a depression therein, wherein the elastic member may comprise a surface facing the side surface of the first module when the first module is received in the first recess, the surface of the elastic member including a projection that aligns with and is received by the depression when the first module is received in the first recess.

The terminal body may include a concave detachment groove on opposite sides of the first recess.

The second module may comprise a first side surface that includes a first groove-shaped guide, a second side surface that includes a second groove-shaped guide and a third side surface that includes a second contact terminal, wherein the second recess may comprise a first side surface that includes a first guide rail and a second side surface that includes a second guide rail, the first groove-shaped guide configured to receive the first guide rail and the second groove-shaped guide configured to receive the second guide rail when the second module is slideably inserted into and received in the second recess, and wherein a second connector disposed in the second recess may be configured to make contact with the second contact terminal when the second module is received in the second recess.

One of the side surfaces of the second recess may further comprise an elastic member, the elastic member including a surface, with a projection thereon, that faces a corresponding one of the side surfaces of the second module when the second module is received in the second recess, and wherein the corresponding side surface of the second module may further comprise a depression therein, and when the second module is received in the second recess, the projection on the surface of the elastic member aligns with and is received by the depression on the side surface of the second module.

The second recess may further comprise a third side surface facing the third surface of the second module when the second module is received in the second recess, the third side of the second recess including a projection, and wherein the third side surface of the second module may comprise a depression that aligns with and is configured to receive the projection on the third side surface of the second recess when the second module is received in the second recess.

The third module may comprise a first, second and third side surface and a groove-shaped guide along the first, second and third side surfaces, wherein the third recess may comprise a first, second and third side surface, each facing the first, second and third surface of the third module, respectively, when the third module is received in the third recess, wherein the third recess may further comprise a guide rail along the first, second and third side surfaces of the third recess, and wherein the groove-shaped guide along the first, second and third side surfaces of the third module may be configured to receive the guide rail along the first, second and third side surfaces of the third recess when the third module is slideably inserted into and received in the third recess.

The third module may further comprise a third contact terminal on one of the first, second or third side surfaces of the third module, and wherein a third connector disposed in the third recess may be configured to make contact with the third contact terminal when the third module is received in the third recess.

The third module may further comprise a magnetic member, and wherein the third recess may further comprise a metallic member disposed within one of the first, second or third side surfaces of the third recess, the magnetic member and the metallic member aligning with each other when the third module is received in the third recess.

The mobile terminal may further include: a display unit disposed on the terminal body; and a pin module mounted on the printed circuit board having a plurality of pins exposed through an opening in the printed circuit board, wherein the display unit comprises a flexible printed circuit board that is configured to make an electrical connection with the second pin module.

The mobile terminal may further include a battery, wherein the printed circuit board may have a recess in which the battery is disposed.

Electronic components may be mounted on the printed circuit board above and below the battery.

A rib may be disposed outside the recessed region in which the battery is disposed.

In addition, there is provided a mobile terminal including a terminal body including first, second and third recesses formed in a back surface of the terminal body; first, second and third detachable modules, wherein the first, second and third recesses are configured to receive the first, second and third modules, respectively; a printed circuit board; a pin module mounted to the printed circuit board and exposed through a bottom surface of the first, second and third recesses, wherein a first, second and third contact terminal may be disposed on a bottom-facing surface of the first, second, and third modules, respectively, and wherein each of the first, second and third contact terminals may be configured to make an electrical connection with the pin module when the first, second and third modules are received in the first, second and third recesses, respectively.

Each of the first, second and third modules may be configured to be inserted into or removed from the first, second and third recesses, respectively, by moving the first, second and third modules in a direction perpendicular to the back surface of the terminal body, wherein the bottom-facing surface of each of the first, second, and third modules may further comprise a magnetic member, and the bottom surface of each of the first, second and third recesses includes a metallic member, and wherein each magnetic member may be configured to align with a corresponding one of the metallic members when the first, second and third modules are received in the first, second and third recesses.

The pin module may connect with the first, second and third contact terminals through an opening in the printed circuit board.

The pin module may comprise: a plurality of pins, exposed through the opening in the printed circuit board, which come in contact with the first, second and third contact terminals; a pin body on which the plurality pins are disposed; and a mounting part formed at both sides of the pin body and mounted on the printed circuit board.

In addition, there is provided a mobile terminal including a display unit; a printed circuit board disposed behind the display unit; a flexible printed circuit board configured to electrically connect the display unit and the printed circuit board; a terminal body configured to receive the printed circuit board; and a pin module exposed through a through an opening in the printed circuit board, wherein the flexible printed circuit board may be electrically connected with the pin module through the opening in the printed circuit board.

The pin module may comprise: a plurality of pins in contact with a contact terminal disposed on the flexible printed circuit board; a pin body on which the plurality of pins are disposed; and a mounting part disposed at an end of the pin body and configured to fix the pin body to the printed circuit board.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be connected with the other element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

A terminal in the present description may include a mobile terminal such as a portable phone, a smart phone, a notebook computer, a digital broadcasting terminal, Personal Digital Assistants (PDA), Portable Multimedia Player (PMP), a navigation system, a slate PC, a tablet PC, an ultra book, a wearable device (e.g., smart watch), a glass-type terminal (e.g., smart glass), a head mounted display (HMD), etc.

However, it will be obvious to those skilled in the art that the present invention may be also applicable to a fixed terminal such as a digital TV, a desktop computer and a digital signage, except for specific configurations for mobility.

Figure 1A:
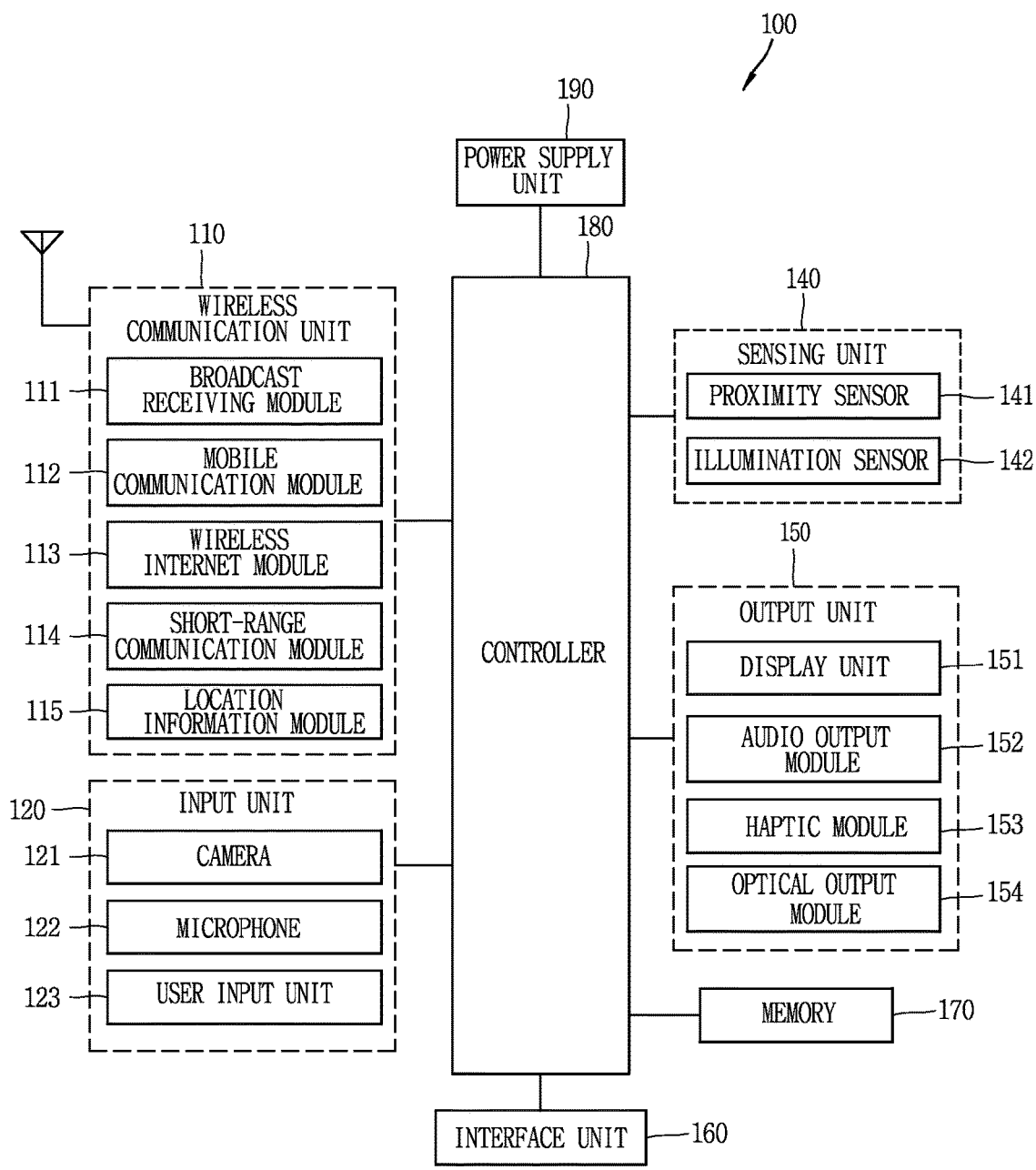
FIG. 1A is a block diagram illustrating a mobile terminal associated with the present invention.
Figure 1B:
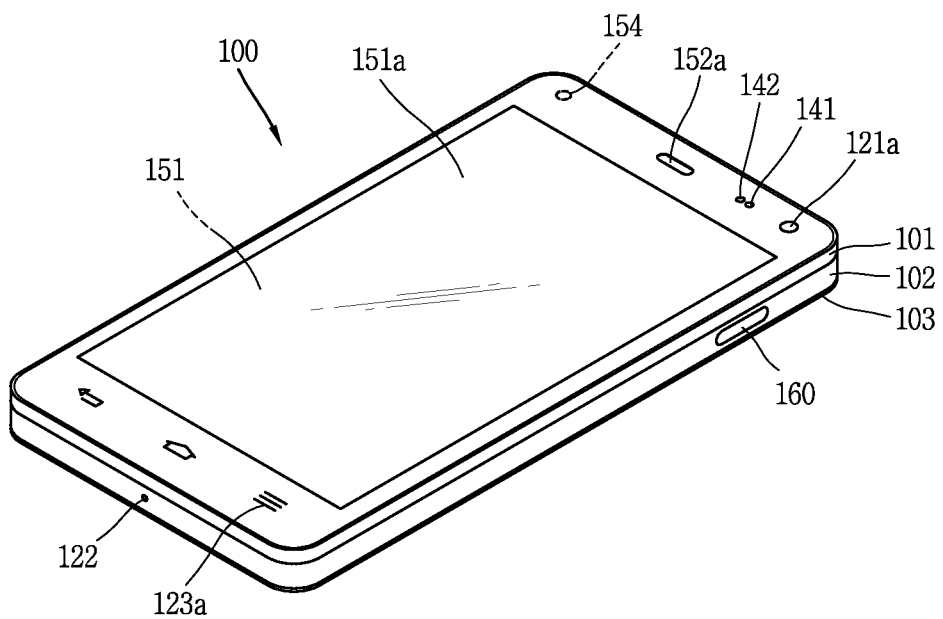
FIGS. 1B and 1C are conceptual diagrams showing an example of a mobile terminal associated with the present invention, which is seen in different directions.
Figure 1C:
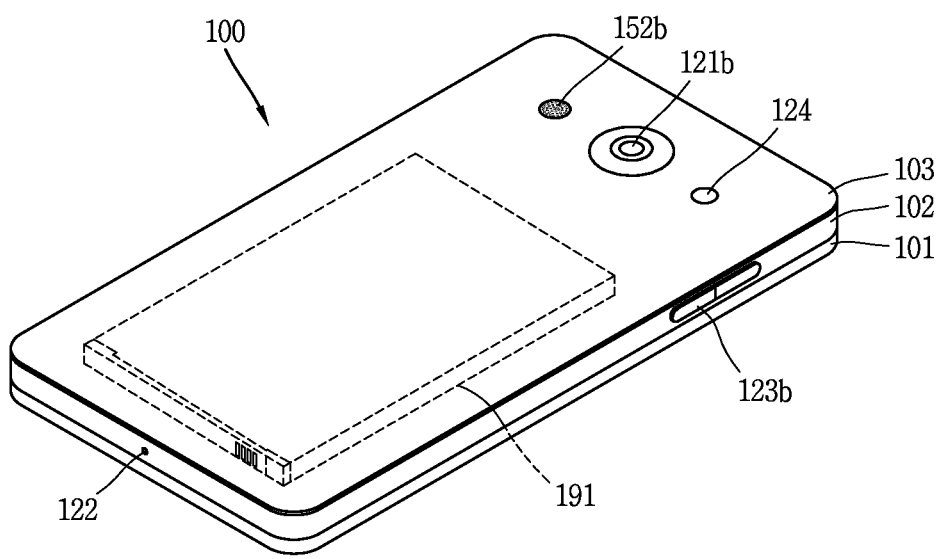

Reference is now made to FIGS. 1A-1C, where FIG. 1A is a block diagram of a mobile terminal in accordance with the present disclosure, and FIGS. 1B and 1C are conceptual views of one example of the mobile terminal, viewed from different directions.

The mobile terminal 100 is shown having components such as a wireless communication unit 110, an input unit 120, a sensing unit 140, an output unit 150, an interface unit 160, a memory 170, a controller 180, and a power supply unit 190. It is understood that implementing all of the illustrated components of FIG. 1A is not a requirement, and that greater or fewer components may alternatively be implemented.

Referring now to FIG. 1A, the mobile terminal 100 is shown having wireless communication unit 110 configured with several commonly implemented components. For instance, the wireless communication unit 110 typically includes one or more components which permit wireless communication between the mobile terminal 100 and a wireless communication system or network within which the mobile terminal is located.

The wireless communication unit 110 typically includes one or more modules which permit communications such as wireless communications between the mobile terminal 100 and a wireless communication system, communications between the mobile terminal 100 and another mobile terminal, communications between the mobile terminal 100 and an external server. Further, the wireless communication unit 110 typically includes one or more modules which connect the mobile terminal 100 to one or more networks. To facilitate such communications, the wireless communication unit 110 includes one or more of a broadcast receiving module 111, a mobile communication module 112, a wireless Internet module 113, a short-range communication module 114, and a location information module 115.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed by controller 180 according to device parameters, user commands, and combinations thereof.

The sensing unit 140 is typically implemented using one or more sensors configured to sense internal information of the mobile terminal, the surrounding environment of the mobile terminal, user information, and the like. For example, in FIG. 1A, the sensing unit 140 is shown having a proximity sensor 141 and an illumination sensor 142. If desired, the sensing unit 140 may alternatively or additionally include other types of sensors or devices, such as a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The mobile terminal 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display unit 151, an audio output module 152, a haptic module 153, and an optical output module 154.

The display unit 151 may have an inter-layered structure or an integrated structure with a touch sensor in order to facilitate a touch screen. The touch screen may provide an output interface between the mobile terminal 100 and a user, as well as function as the user input unit 123 which provides an input interface between the mobile terminal 100 and the user.

The interface unit 160 serves as an interface with various types of external devices that can be coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). It is common for application programs to be stored in the memory 170, installed in the mobile terminal 100, and executed by the controller 180 to perform an operation (or function) for the mobile terminal 100.

The controller 180 typically functions to control overall operation of the mobile terminal 100, in addition to the operations associated with the application programs. The controller 180 may provide or process information or functions appropriate for a user by processing signals, data, information and the like, which are input or output by the various components depicted in FIG. 1A, or activating application programs stored in the memory 170. As one example, the controller 180 controls some or all of the components illustrated in FIGS. 1A-1C according to the execution of an application program that have been stored in the memory 170.

The power supply unit 190 can be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

At least some of the above components may operate in a cooperating manner, so as to implement an operation or a control method of a glass type terminal according to various embodiments to be explained later. The operation or the control method of the glass type terminal may be implemented on the glass type terminal by driving at least one application program stored in the memory 170.

Referring now to FIGS. 1B and 1C, the mobile terminal 100 is described with reference to a bar-type terminal body. However, the mobile terminal 100 may alternatively be implemented in any of a variety of different configurations. Examples of such configurations include watch-type, clip-type, glasses-type, or as a folder-type, flip-type, slide-type, swing-type, and swivel-type in which two and more bodies are combined with each other in a relatively movable manner, and combinations thereof. Discussion herein will often relate to a particular type of mobile terminal (for example, bar-type, watch-type, glasses-type, and the like). However, such teachings with regard to a particular type of mobile terminal will generally apply to other types of mobile terminals as well.

The mobile terminal 100 will generally include a case (for example, frame, housing, cover, and the like) forming the appearance of the terminal. In this embodiment, the case is formed using a front case 101 and a rear case 102. Various electronic components are incorporated into a space formed between the front case 101 and the rear case 102. At least one middle case may be additionally positioned between the front case 101 and the rear case 102.

The display unit 151 is shown located on the front side of the terminal body to output information. As illustrated, a window 151a of the display unit 151 may be mounted to the front case 101 to form the front surface of the terminal body together with the front case 101.

In some embodiments, electronic components may also be mounted to the rear case 102. Examples of such electronic components include a detachable battery 191, an identification module, a memory card, and the like. Rear cover 103 is shown covering the electronic components, and this cover may be detachably coupled to the rear case 102. Therefore, when the rear cover 103 is detached from the rear case 102, the electronic components mounted to the rear case 102 are externally exposed.

As illustrated, when the rear cover 103 is coupled to the rear case 102, a side surface of the rear case 102 is partially exposed. In some cases, upon the coupling, the rear case 102 may also be completely shielded by the rear cover 103. In some embodiments, the rear cover 103 may include an opening for externally exposing a camera 121b or an audio output module 152b.

The cases 101, 102, 103 may be formed by injection-molding synthetic resin or may be formed of a metal, for example, stainless steel (STS), aluminum (Al), titanium (Ti), or the like.

As an alternative to the example in which the plurality of cases form an inner space for accommodating components, the mobile terminal 100 may be configured such that one case forms the inner space. In this example, a mobile terminal 100 having a uni-body is formed in such a manner that synthetic resin or metal extends from a side surface to a rear surface.

If desired, the mobile terminal 100 may include a waterproofing unit (not shown) for preventing introduction of water into the terminal body. For example, the waterproofing unit may include a waterproofing member which is located between the window 151a and the front case 101, between the front case 101 and the rear case 102, or between the rear case 102 and the rear cover 103, to hermetically seal an inner space when those cases are coupled.

The display unit 151, the first audio output module 152a, the second audio output module 152b, the proximity sensor 141, the illumination sensor 142, the optical output module 154, a first camera 121a, a second camera 121b, the first manipulation unit 123a, the second manipulation unit 123b, the microphone 122, the interface 160, etc. may be provided at the mobile terminal 100.

As shown in FIGS. 1B and 1C, the display unit 151, the first audio output module 152a, the proximity sensor 141, the illumination sensor 142, the optical output module 154, the first camera 121a and the first manipulation unit 123a are arranged on a front surface of the terminal body. The second manipulation unit 123b, the microphone 122 and the interface 160 are arranged on side surfaces of the terminal body. And the second audio output module 152b and the second camera 121b are arranged on a rear surface of the terminal body.

However, it is to be understood that alternative arrangements are possible and within the teachings of the instant disclosure. Some components may be omitted or rearranged. For example, the first manipulation unit 123a may be located on another surface of the terminal body, and the second audio output module 152b may be located on the side surface of the terminal body.

The display unit 151 outputs information processed in the mobile terminal 100. The display unit 151 may be implemented using one or more suitable mobile terminals.

Examples of such suitable mobile terminals include a liquid crystal display (LCD), a thin film transistor-liquid crystal display (TFT-LCD), an organic light emitting diode (OLED), a flexible display, a 3-dimensional (3D) display, an e-ink display, and combinations thereof.

The display unit 151 may be implemented using two mobile terminals, which can implement the same or different display technology. For instance, a plurality of the display units 151 may be arranged on one side, either spaced apart from each other, or these devices may be integrated, or these devices may be arranged on different surfaces.

The display unit 151 may also include a touch sensor which senses a touch input received at the display unit. When a touch is input to the display unit 151, the touch sensor may be configured to sense this touch and the controller 180, for example, may generate a control command or other signal corresponding to the touch. The content which is input in the touching manner may be a text or numerical value, or a menu item which can be indicated or designated in various modes.

The touch sensor may be configured in a form of a film having a touch pattern, disposed between the window 151a and a display on a rear surface of the window 151a, or a metal wire which is patterned directly on the rear surface of the window 151a. Alternatively, the touch sensor may be integrally formed with the display. For example, the touch sensor may be disposed on a substrate of the display or within the display.

The display unit 151 may also form a touch screen together with the touch sensor. Here, the touch screen may serve as the user input unit 123 (see FIG. 1A). Therefore, the touch screen may replace at least some of the functions of the first manipulation unit 123a.

The first audio output module 152a may be implemented in the form of a receiver, and the second audio output module 152b may be implemented in the form of a loud speaker to output voice audio, alarm sounds, multimedia audio reproduction, and the like.

The window 151a of the display unit 151 will typically include an aperture to permit audio generated by the first audio output module 152a to pass. One alternative is to allow audio to be released along an assembly gap between the structural bodies (for example, a gap between the window 151a and the front case 101). In this case, a hole independently formed to output audio sounds may not be seen or is otherwise hidden in terms of appearance, thereby further simplifying the appearance and manufacturing of the mobile terminal 100.

The optical output module 154 can be configured to output light for indicating an event generation. Examples of such events include a message reception, a call signal reception, a missed call, an alarm, a schedule notice, an email reception, information reception through an application, and the like. When a user has checked a generated event, the controller can control the optical output unit 154 to stop the light output.

The first camera 121a can process image frames such as still or moving images obtained by the image sensor in a capture mode or a video call mode. The processed image frames can then be displayed on the display unit 151 or stored in the memory 170.

The first and second manipulation units 123a and 123b are examples of the user input unit 123, which may be manipulated by a user to provide input to the mobile terminal 100. The first and second manipulation units 123a and 123b may also be commonly referred to as a manipulating portion, and may employ any tactile method that allows the user to perform manipulation such as touch, push, scroll, or the like. The first and second manipulation units 123a and 123b may be implemented in a user's non-tactile manner, e.g., by a proximity touch, a hovering touch, etc.

FIG. 1B illustrates the first manipulation unit 123a as a touch key, but possible alternatives include a mechanical key, a push key, a touch key, and combinations thereof.

Input received at the first and second manipulation units 123a and 123b may be used in various ways. For example, the first manipulation unit 123a may be used by the user to provide an input to a menu, home key, cancel, search, or the like, and the second manipulation unit 123b may be used by the user to provide an input to control a volume level being output from the first or second audio output modules 152a or 152b, to switch to a touch recognition mode of the display unit 151, or the like.

As another example of the user input unit 123, a rear input unit (not shown) may be located on the rear surface of the terminal body. The rear input unit can be manipulated by a user to provide input to the mobile terminal 100. The input may be used in a variety of different ways. For example, the rear input unit may be used by the user to provide an input for power on/off, start, end, scroll, control volume level being output from the first or second audio output modules 152a or 152b, switch to a touch recognition mode of the display unit 151, and the like. The rear input unit may be configured to permit touch input, a push input, or combinations thereof.

The rear input unit may be located to overlap the display unit 151 of the front side in a thickness direction of the terminal body. As one example, the rear input unit may be located on an upper end portion of the rear side of the terminal body such that a user can easily manipulate it using a forefinger when the user grabs the terminal body with one hand. Alternatively, the rear input unit can be positioned at most any location of the rear side of the terminal body.

Embodiments that include the rear input unit may implement some or all of the functionality of the first manipulation unit 123a in the rear input unit. As such, in situations where the first manipulation unit 123a is omitted from the front side, the display unit 151 can have a larger screen.

As a further alternative, the mobile terminal 100 may include a finger scan sensor which scans a user's fingerprint. The controller 180 can then use fingerprint information sensed by the finger scan sensor as part of an authentication procedure. The finger scan sensor may also be installed in the display unit 151 or implemented in the user input unit 123.

The microphone 122 is shown located at an end of the mobile terminal 100, but other locations are possible. If desired, multiple microphones may be implemented, with such an arrangement permitting the receiving of stereo sounds.

The interface unit 160 may serve as a path allowing the mobile terminal 100 to interface with external devices. For example, the interface unit 160 may include one or more of a connection terminal for connecting to another device (for example, an earphone, an external speaker, or the like), a port for near field communication (for example, an Infrared Data Association (IrDA) port, a Bluetooth port, a wireless LAN port, and the like), or a power supply terminal for supplying power to the mobile terminal 100. The interface unit 160 may be implemented in the form of a socket for accommodating an external card, such as Subscriber Identification Module (SIM), User Identity Module (UIM), or a memory card for information storage.

The second camera 121b is shown located at the rear side of the terminal body and includes an image capturing direction that is substantially opposite to the image capturing direction of the first camera unit 121a. If desired, second camera 121a may alternatively be located at other locations, or made to be moveable, in order to have a different image capturing direction from that which is shown.

The second camera 121b can include a plurality of lenses arranged along at least one line. The plurality of lenses may also be arranged in a matrix configuration. The cameras may be referred to as an "array camera." When the second camera 121b is implemented as an array camera, images may be captured in various manners using the plurality of lenses and images with better qualities.

As shown in FIG. 1C, a flash 124 is shown adjacent to the second camera 121b. When an image of a subject is captured with the camera 121b, the flash 124 may illuminate the subject.

As shown in FIG. 1B, the second audio output module 152b can be located on the terminal body. The second audio output module 152b may implement stereophonic sound functions in conjunction with the first audio output module 152a, and may be also used for implementing a speaker phone mode for call communication.

At least one antenna for wireless communication may be located on the terminal body. The antenna may be installed in the terminal body or formed by the case. For example, an antenna which configures a part of the broadcast receiving module 111 (refer to FIG. 1A) may be retractable into the terminal body. Alternatively, an antenna may be formed using a film attached to an inner surface of the rear cover 103, or a case that includes a conductive material.

A power supply unit 190 for supplying power to the mobile terminal 100 may include a battery 191, which is mounted in the terminal body or detachably coupled to an outside of the terminal body. The battery 191 may receive power via a power source cable connected to the interface unit 160. Also, the battery 191 can be recharged in a wireless manner using a wireless charger. Wireless charging may be implemented by magnetic induction or electromagnetic resonance.

The rear cover 103 is shown coupled to the rear case 102 for shielding the battery 191, to prevent separation of the battery 191, and to protect the battery 191 from an external impact or from foreign material. When the battery 191 is detachable from the terminal body, the rear case 103 may be detachably coupled to the rear case 102.

An accessory for protecting an appearance or assisting or extending the functions of the mobile terminal 100 can also be provided on the mobile terminal 100. As one example of an accessory, a cover or pouch for covering or accommodating at least one surface of the mobile terminal 100 may be provided. The cover or pouch may cooperate with the display unit 151 to extend the function of the mobile terminal 100. Another example of the accessory is a touch pen for assisting or extending a touch input to a touch screen.

Hereinafter, exemplary embodiments of a control method which may be implemented in a mobile terminal having the above-described configuration will be described in detail with reference to the accompanying drawings. It is obvious to those skilled in the art that the present invention may be embodied in another specific form without departing from the spirit and essential features of the present invention.

Figure 2:
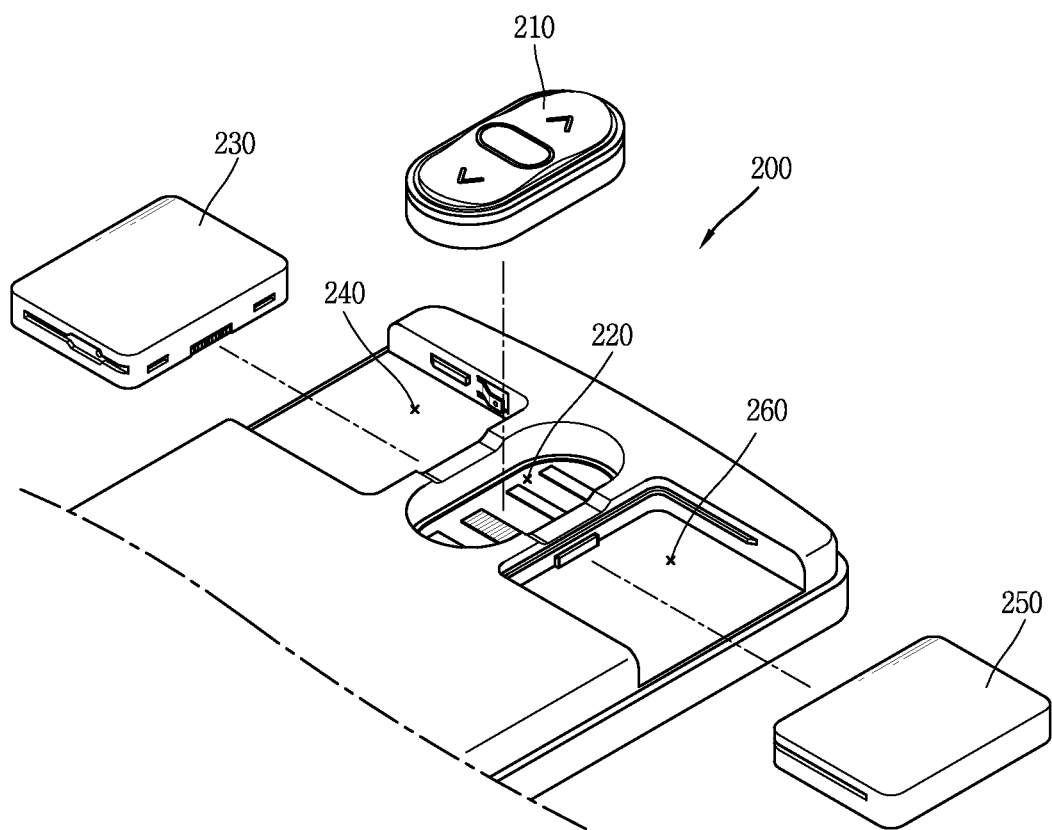
FIG. 2 is an exploded perspective view of a mobile terminal according to an embodiment of the present invention.
Figure 3:
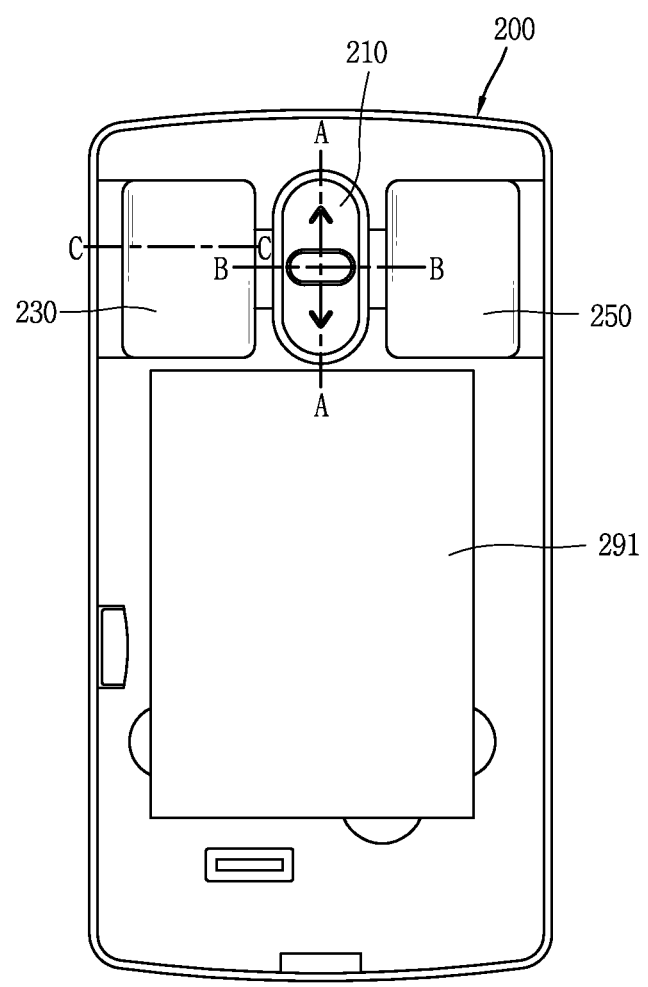
FIG. 3 shows a state in which three modules of FIG. 2 are coupled with a body of a terminal.
Figure 4A:
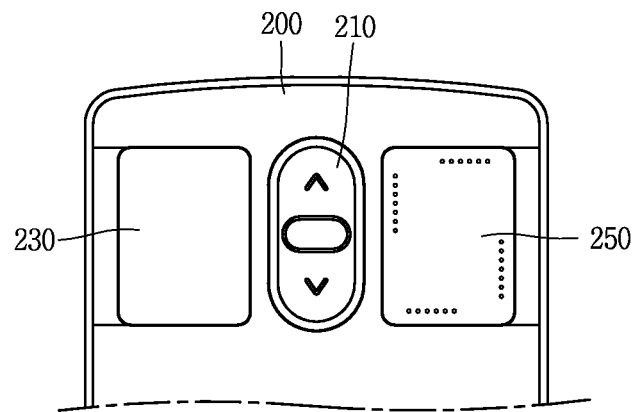
FIG. 4A to 4C are cross sectional views taken along A-A of FIG. 3.
Figure 4B:
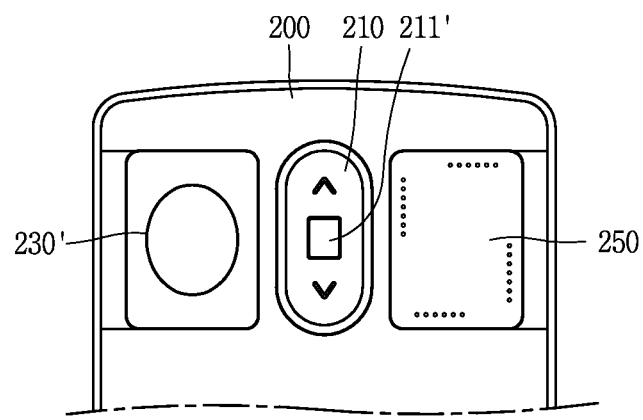
Figure 4C:
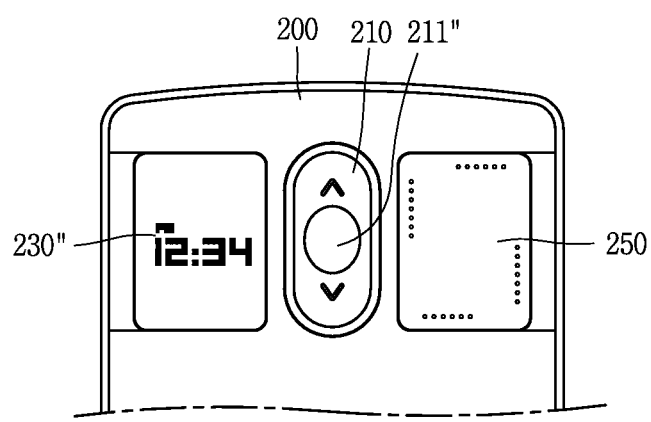

FIG. 2 is an exploded perspective view of a mobile terminal 200 according to an embodiment of the present invention, which shows three modules are separated from a terminal body 204, and FIG. 3 shows a state in which the three modules of FIG. 2 are coupled with the terminal body 204, and FIG. 4 is a cross sectional view taken along A-A of FIG. 3.

The mobile terminal 200 according to an embodiment of the present invention will be described below with reference to FIGS. 2 to 4.

Referring to FIGS. 2 to 4, the mobile terminal 200 according to an embodiment of the present invention includes the terminal body 204 and one or more modules 210, 230, and 250 that are detachable from a back side of the terminal body 204. Recesses 220, 240, and 260 for receiving the modules are formed at the back side of the terminal body 204. The modules 210, 230, and 250 are accommodated by the recesses 220, 240, and 260 and electrically connected to a printed circuit substrate 280. In this case, first to third contact terminals 214a, 234, and 254 are formed in the modules 210, 230, and 250 and configured to come in contact with connectors 225, 245, and 265 having one or more electrode regions R1, R2, R3, and R4. Thus the modules 210, 230, and 250 are electrically connected with the printed circuit board 280.

The modules are replaceable for a user's convenience. The number of modules is shown as three in FIGS. 2 and 3, but is not limited thereto. However, for convenience, the following description will be made on the assumption that the number of modules is three.

The modules are disposed on a back surface of the terminal body 204 and include a first module 210 disposed in an upper central portion to receive a push input and second and third modules 230 and 250 disposed at both sides of the first module 210. That is, the first module 210 may be a back side input module, and will be described to receive the push input, but is not limited thereto. However, the first module 210 may receive a touch input. The push or touch input would be obvious to those skilled in the art, and its detailed description will be omitted.

The first to third modules 210, 230, and 250 may be received by the recesses 220, 240, and 260, respectively. In detail, the first module 210 is received by the first recess 220, the second module 230 is received by the second recess 240, and the third module 250 is received by the third recess 260. FIGS. 2 and 3 illustrate that the second recess 240 and the third recess 260 are formed at the left and right of the first recess 220, but are not limited thereto. However, the second recess 240 and the third recess 260 may be formed above and below the first recess 220. In addition, four modules and recesses may be disposed above, below, and to the left and right of the first recess 220.

The first module 210 will be described first.

Figure 17:
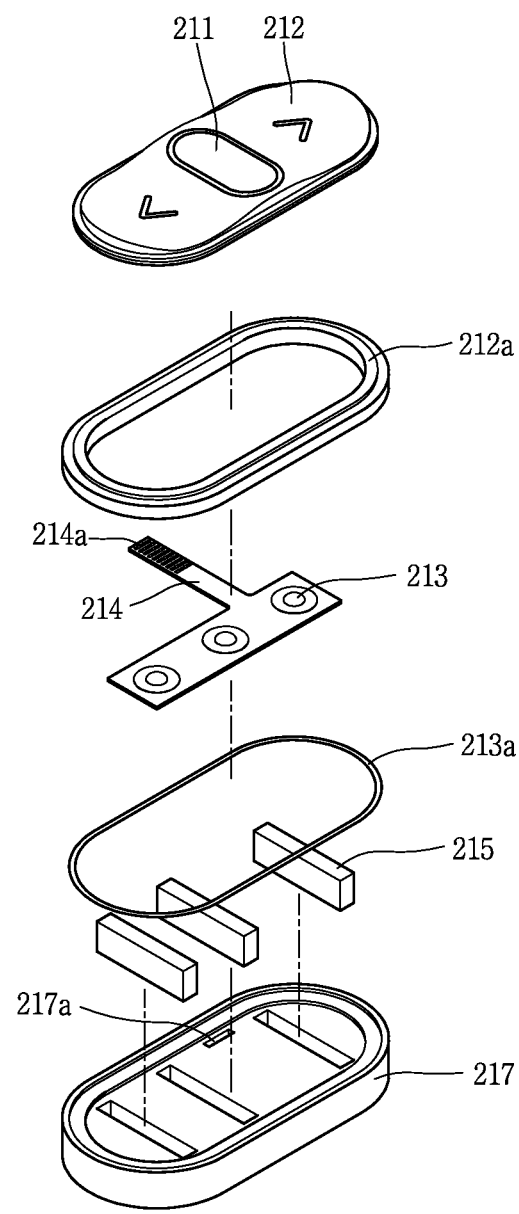
FIG. 17 is an exploded perspective view of a first module according to an embodiment of the present invention.

FIG. 17 is an exploded perspective view of a first module according to an embodiment of the present invention. Referring to FIG. 17, the first module 210 is a back side input module, as described above, and includes a first button 211 configured to receive a push input for a first function, a second button 212 disposed adjacent to the first button 211 and configured to receive a push input for a second function, a dome switch 213 disposed below the first button 211 and the second button 212 and configured to transfer the push input from the first button 211 or second button 212, and a flexible printed circuit board 214 disposed below the dome switch 213 and having a plurality of first contact terminals 214a formed therein.

Furthermore, the first module 210 may further include a support body disposed below the first and second buttons 211 and 212 and configured to support the first and second buttons 211 and 212 and also further include a bracket 217 configured to accommodate the support body 212a, the first and second buttons 211 and 212 and the flexible printed circuit board.

The first function may be a function associated with on/off of a power source and activation of the display unit, and the second function may be a function associated with adjustment of a sound level output by a main body of a terminal or a function of scrolling output information of the display unit. In this case, the first button 211 is disposed at a center of the second button 212.

Figure 6:
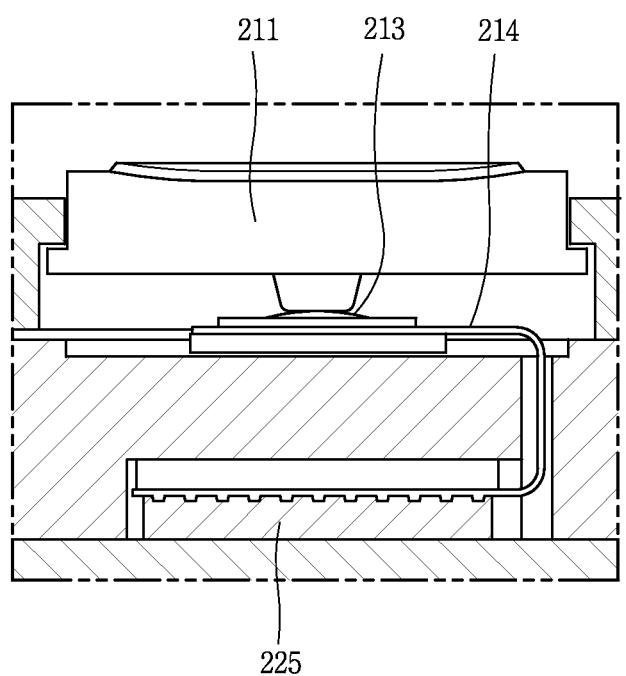
FIG. 6 is a cross sectional view taken along B-B of FIG. 3.

The plurality of first contact terminals 214a are formed in the flexible printed circuit board 214, and the plurality of first contact terminals 214a are in electrical contact with an electrode 225a of a first connector 225 disposed inside the first recess 220. FIG. 6 is a cross sectional view taken along BB of FIG. 3. It can be seen from FIG. 6 that the flexible printed circuit board 214 is bent to be connected to the first connector 225. The first connector 225 may be a zebra connector. A second connector and a third connector 265 to be described below may also be a zebra connector.

Figure 7:
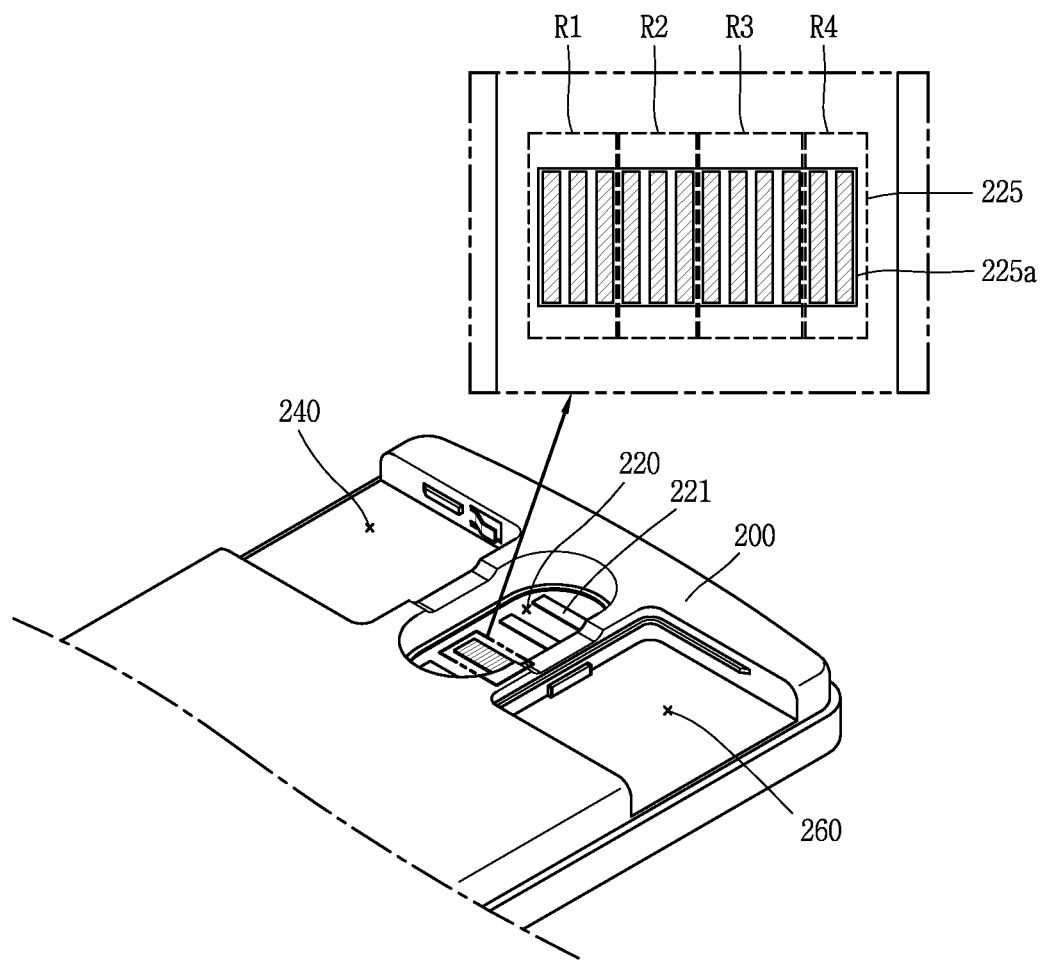
FIG. 7 shows a first recess and a first connector in an embodiment of the present invention.

FIG. 7 shows the first recess 220 and the first connector 225 in an embodiment of the present invention. One or more first metallic members 221 are disposed in the first recess 220, and a first magnetic member 215 is disposed on a position corresponding to the first metallic member 221 inside the first module 210. Thus the first metallic member 221 and the first magnetic member 215 may be detachable from each other by a magnetic force. In this case, the first metallic member 221 is disposed in the first module 210, and the first magnetic member 215 is disposed in the first recess.

The first connector 225 is designed to have at least 14 or more pins such that the first connector 225 is connected to contact lines allocated thereto and connected to the flexible printed circuit board 214 through the contact lines. For example, various sensors 211' and 211" (see FIG. 5) may be built in the first module 210. In particular, the sensors, for example, a heart rate sensor, a fingerprint recognition sensor, or a laser detection auto-focus (LDAF) sensor may be built in the first button 211. Contact terminals for driving the hear rate sensor, the fingerprint recognition sensor, and the LDAF sensor may be formed in separate regions on the flexible printed circuit board 214. When the contact terminals are formed in separate regions of the flexible printed circuit board 214, electrodes should be formed in regions R1, R2, R3, and R4 of the first connector 225. However, if the sensors share the first contact terminals 214a formed on the flexible printed circuit board 214, the number of electrodes 225a in the first connector 225 would be reduced.

Figure 8A:
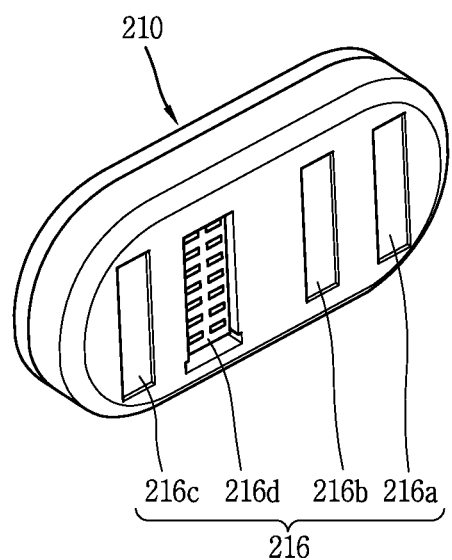
FIGS. 8A and 8B are a perspective view of a first module seen from behind and a perspective view of a flexible printed circuit board according to an embodiment of the present invention.
Figure 8B:
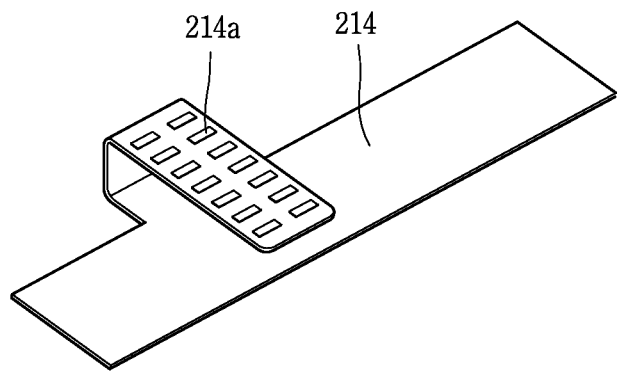

FIG. 8 shows a perspective view of the first module 210 seen from behind and a perspective view of the flexible printed circuit board 214 according to an embodiment of the present invention. As shown in FIG. 8A, a plurality of grooves 216 are formed at the back side of the first module 210. Among these grooves, three grooves 216a, 216b, and 216c are spaces for accommodating the first metallic members 221, and another groove 216d is a space for accommodating the first connector 225. As shown in FIG. 8B, it can be seen that the flexible printed circuit board 214 is bent to be in contact with the first connector 225.

As shown in FIG. 17, the dome switch 213 is formed on the flexible printed circuit board 214. The flexible printed circuit board 214 is bent to the outside through a through hole 217a formed in the bracket 217 that supports the first button 211 and the second button 212. Thus, the flexible printed circuit board 214 is electrically connected to the first connector 225.

In this case, as shown in FIG. 20, a detachment groove 222 may be formed to be concave at both sides of the first recess 220. The detachment groove 222 denotes a part with which a body of a user is in contact, in order to facilitate attachment or detachment of the first module 210. However, the detachment groove 222 is not formed only at the part to or from which the first module 210 is attached or detached, and may be formed at a recess configured to accommodate a module attached or detached in a thickness direction of the mobile terminal 200. For example, although not shown, this may correspond to a case of FIG. 22 to be described below.

It has been described that the first module 210 is attached or detached with a magnetic force between the first magnetic member 215 and the first metallic member 221. A structure for preventing the first module 210 from falling out of the first recess 220 will be described below.

Figure 18A:
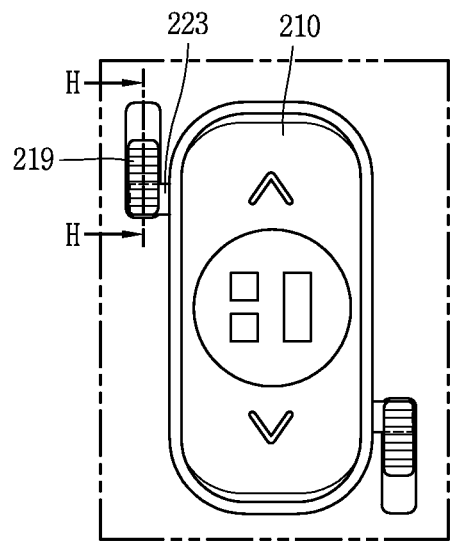
FIG. 18A shows a state in which a first module is engaged according to an embodiment of the present invention.
Figure 18B:
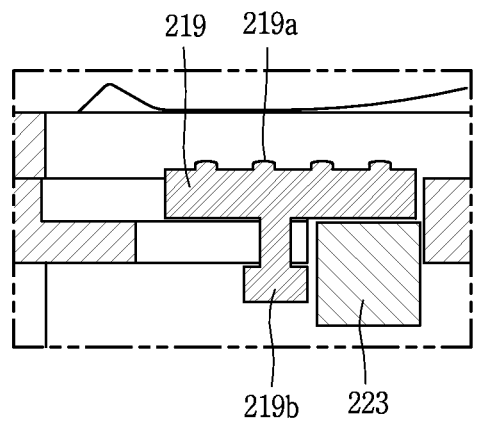
FIG. 18B is a cross sectional view taken along H-H of FIG. 18A.
Figure 19A:
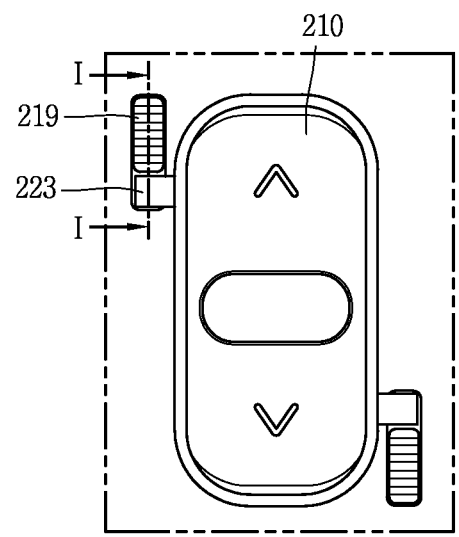
FIG. 19A shows a state in which in which a first module is detachable.
Figure 19B:
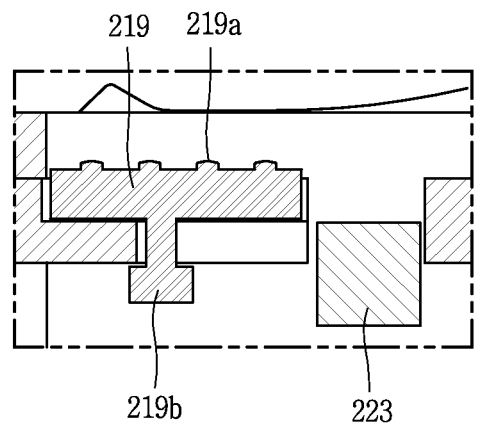
FIG. 19B is a cross sectional view taken along I-I of FIG. 19A.

FIGS. 18 and 19 are diagrams for describing an engagement state of the first module 210 according to another embodiment of the present invention. FIG. 18 shows a state in which the first module 210 is engaged, and FIG. 19 shows a state in which the first module 210 is detachable.

Referring to FIGS. 18 and 19, a protrusion 223 is formed on a bottom of the first module 210, and a cover 219 is formed on a bottom of the first recess 220 and configured to selectively cover the protrusion 223 to prevent the first module 210 from falling out. It is sufficient that the protrusion 223 is formed at at least one position. However, it is preferable that the protrusion 223 may be formed at two or more positions. The cover 219 is movable on the protrusion 223. As the cover 219 is moved, the protrusion 223 is selectively covered. When the cover 219 covers the protrusion 223 (close state), the first module 210 does not fall out of the first recess 220. When the cover 219 does not cover the protrusion 223 (open state), the first module 210 may be easily separated from the first recess 220. In FIGS. 18 and 19, the first magnetic member 215 and the first metallic member 221 may be used without coupling with each other by a magnetic force. However, the first magnetic member 215 and the first metallic member 221 may be used together, as shown in FIG. 4.

In this case, the cover 219 includes slip-resistant parts 219a formed at a predetermined distance from one another on an outer surface thereof and a catching part 219b having a greater width than a passage (not shown) formed at the back side of the terminal body 204. The slip-resistant parts 219a may be formed as a straight line and used to prevent a slide when a user presses and pushes an upper surface of the cover 219. In addition, the approximately T-shaped catching part 219b is formed in the cover 219, and the catching part 219b prevents the cover 219 from falling out.

Figure 20A:
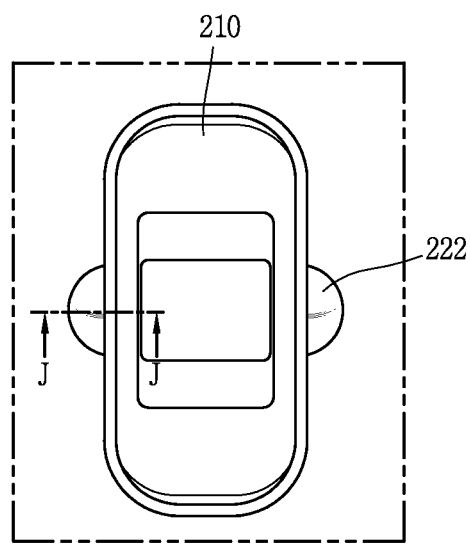
FIG. 20A is a cross sectional view showing a state in which a first module is installed in a first recess.
Figure 20B:
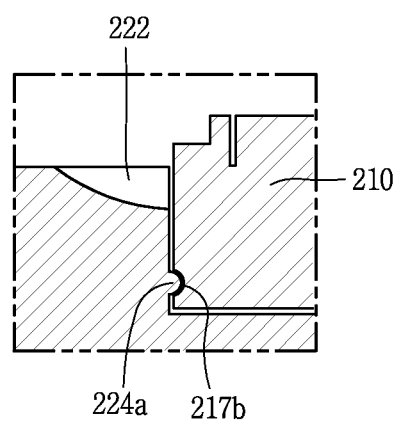
FIG. 20B is a cross sectional view taken along J-J of FIG. 20A.
Figure 21:
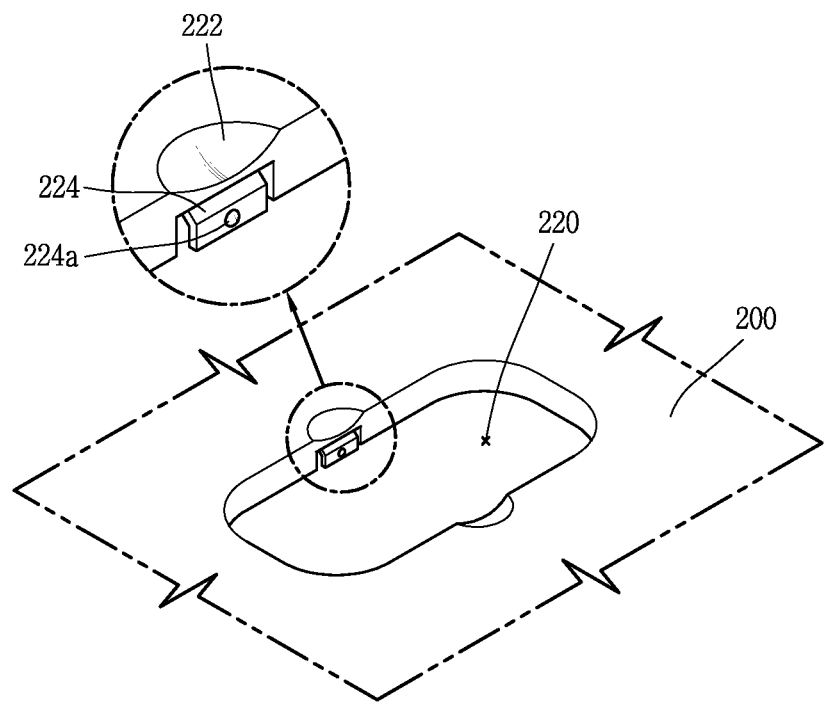
FIG. 21 is a partial perspective view of a first recess when a first module is separated from a first recess according to an embodiment of the present invention.

FIG. 20A is a cross sectional view showing a state in which the first module 210 is installed in the first recess 220, and FIG. 20B is a cross sectional view taken along JJ of FIG. 20A. FIG. 21 is a partial perspective view of the first recess 220 when the first module 210 is separated from the first recess 220. Referring to FIGS. 20 and 21, it can be seen that a first elastic member 224 is formed on a side surface of the first recess 220, a first projection 224a is formed at one side of the first elastic member 224, and a first groove 217b into which the first projection 224a may be inserted is formed on a bottom of the first module 210. In this way, the first module 210 may be attached or detached using the first projection 224a and the first groove 217b.

In this case, the first elastic member 224 may slightly protrude into a space of the first recess 220. When the first module 210 is inserted while the first elastic member 224 protrudes into an inner space of the first recess 220, the first elastic member 224 is pushed back. When the installation of the first module 210 is complete, the first projection 224a formed on the first elastic member 224 is inserted into the first groove 217b formed on the first module 210, thus fixing the first module 210. In this case, a top of the first elastic member 224 is formed to be inclined toward an inner side of the first recess 220 such that the first module 210 may be inserted without being caught by the first elastic member 224. In this case, the detachment grooves 222 are formed at both sides of the first recess 220 such that a user may easily take out the first module 210 upon attachment or detachment of the first module 210.

An embodiment of the present invention provides three solutions to attach or detach the first recess 220 to or from the first recess 220. That is, a method of a fixing method using a magnetic force between the magnetic member 215 and the metallic member 221, a fixing method using the cover 219 and the protrusion 223, and a fixing method using the projection 224a and the groove 217b are illustrated. However, it will be appreciated that these methods need not be used separately, and two or more of the methods may be used together. For example, the first module 210 may be fixed using the groove 217b formed in the first module 210 and the projection 224a formed in the elastic member 224 in addition to using the first magnetic member 215 and the first metallic member 221.

Figure 5:
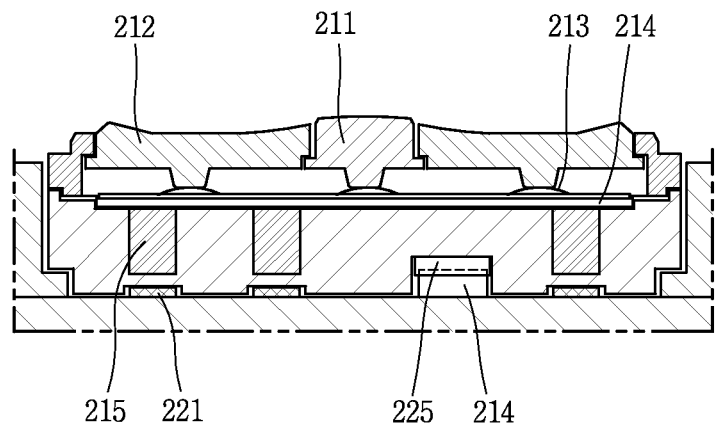
FIG. 5 is a rear view of a mobile terminal according to an embodiment of the present invention.

At least one of a heart rate sensor, a fingerprint recognition sensor, and a laser detection auto-focus (LDAF) sensor may be built in the first button 211. FIG. 5 is a rear view of the mobile terminal 200 according to an embodiment of the present invention, and FIG. 6 is a cross sectional view of the first module 210. The following description will be made with reference to FIGS. 5 and 6.

A main function of the first button 211 is to supply or block power. A small sensor 211' or 211" may also be disposed inside the first button 211.

The first button 211 and the second button 212 are exposed to the outside, and the first button 211 is inserted into a through hole (not shown) formed in the second button 212. The first button 211 may be in a circular shape as an example, and the second button 212 may be formed in an elliptical shape including the first button 211, but are not limited thereto.

In order to operate the back side input module 210, the flexible printed circuit board 214 is disposed below the back side input module 210, and the dome switch 213 is disposed on the flexible printed circuit board 214. According to such disposition, when a user applies a pressure on the first button 211 or second button 212, the flexible printed circuit board 214 and a printed circuit board 280 are electrically connected by the dome switch 213 to operate the first button 211 or the second button 212.

In this case, the LDAF sensor includes a light emitting unit that emits laser and a light receiving unit that receives laser and functions to measure a distance using a phase difference between a transmitted output signal and a received input signal and to perform an auto-focusing operation using the measured phase difference when a still image or a moving picture is captured.

That is, a conventional LDAF sensor (auto focusing (AF)) focuses image processing without laser and thus it takes a time to cover an entire screen. However, the LDAF sensor measures a distance using a phase difference through laser to perform rapidly processing with the laser in the range of about 0 to about 50 cm and perform processing by an existing AF scheme in the other range.

Attachment/detachment structures of the second module 230 and the third module 250 will be described below.

Figure 9:
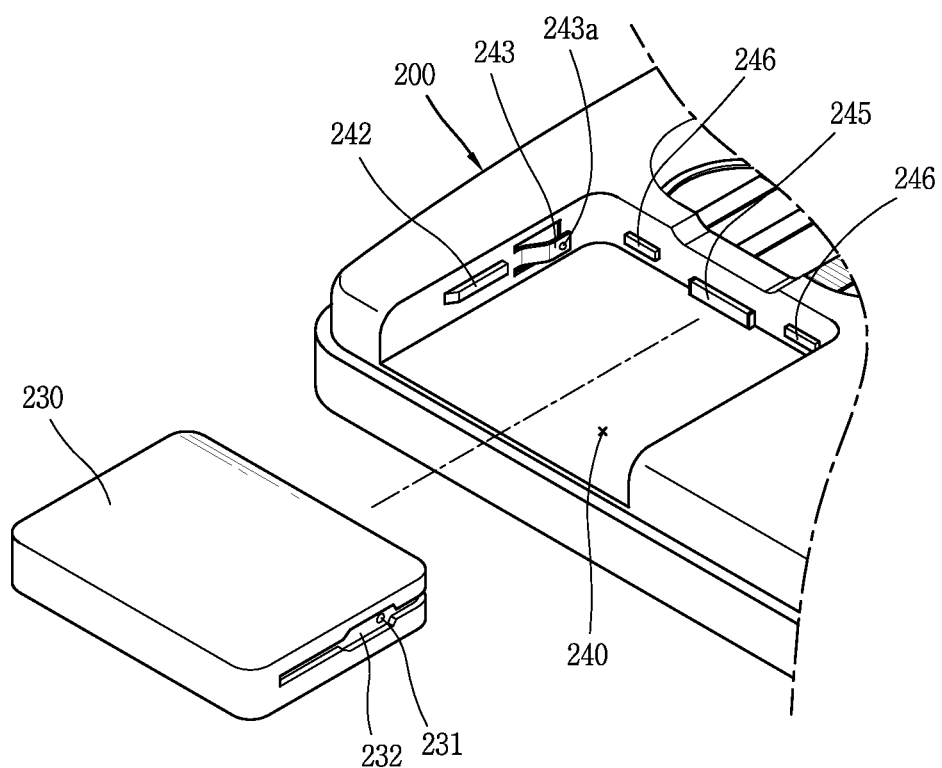
FIG. 9 shows the second module and the second recess according to an embodiment of the present invention.

FIGS. 9 and 11 show the second module 230 and the second recess 240 according to an embodiment of the present invention. FIGS. 12 to 16 show the third module 250 and third recess 260 according to an embodiment of the present invention.

The second module 230 and the third module 250 are disposed at a right or left side of the first module 210. In an embodiment of the present invention, it will be described that the second module 230 is disposed at the left side of the first module 210, and the third module 250 is disposed at the right side of the first module 210. However, an embodiment of the present invention is not limited thereto. In addition, a structure of the second module 230 and the second recess 240 to be described below may be a structure the third module 250 and the second recess 240. A structure of the third module 250 and the third recess 260 may be a structure of the second module 230 and the second recess 240. These structures may be combined properly.

First, the structure of the second module 230 and the second recess 240 will be described.

The second module 230 is attached or detached by sliding from a side surface of the terminal body 204. A guide 232 is formed at both sides of the second module 230 in the sliding direction. A first guide rail 242 is disposed in the second recess 240 such that the guide 232 slides therealong. A second contact terminal 234 is formed at a front surface of the second module 230. The second contact terminal 234 is electrically connected to an electrode 245a of a second connector 245 formed inside the second recess 240.

In this case, the front surface of the second module 230 denotes a surface toward the second recess 240 when the second module 230 slides toward the second recess 240. A back surface of the second module 230 denotes a surface opposite to the front surface. A side surface of the second module 230 denotes a surface between the front surface and the back surface of the second module 230 and a surface that is not exposed to the outside when the second module 230 is installed. These are the same in the case of the third module 250 to be described below.

The second module 230 is installed by sliding from one side, e.g., the left of the terminal body 204, and separated by moving in an opposite direction. That is, the first module 210 is installed or removed in a thickness direction of the mobile terminal 200 while the second module 230 and the third module 250 to be described below are installed or removed by sliding from the left or right of the moving terminal 200.

A second elastic member 243 is formed at an end of the first guide rail 242 to apply a pressure to the second module 230. A second projection 243a that inserted into a second groove 231 formed at each of both sides of the second module 230 is formed in an outer surface of the second elastic member 243. In this case, the second elastic member 243 is formed in the sliding direction of the second module 230, and one or both sides of the first guide rail 242 and the second elastic member 243 are inclined such that the second module 230 may slide smoothly 243b (see FIG. 11). If the guide 232 and the second elastic member 243 formed not to be inclined but vertically, a scratch may occur in the second module 230.

Figure 11A:
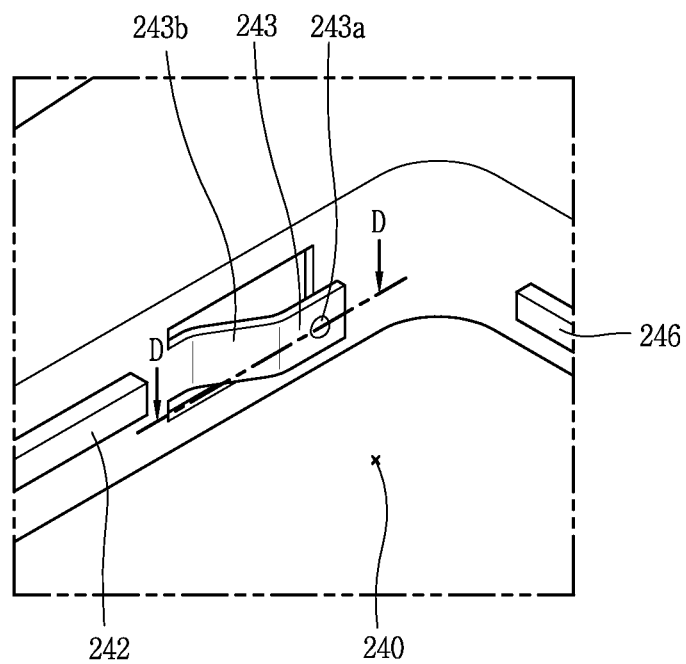
FIG. 11A shows surroundings of the second recess 240.
Figure 11B:
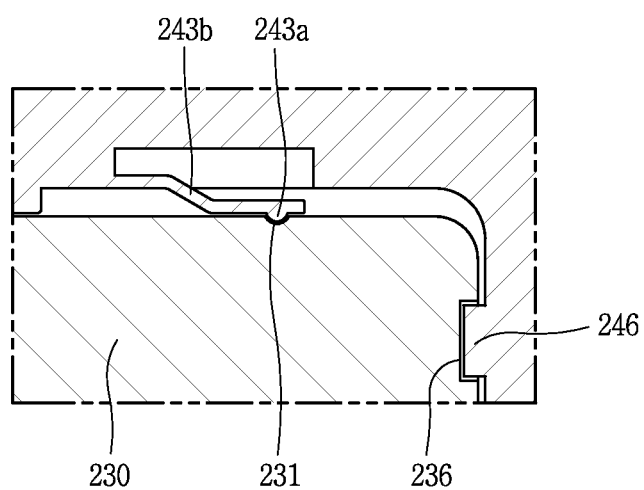
FIG. 11B is a cross sectional view taken along D-D of FIG. 11A.

In addition, the second elastic member 243 slightly protrudes toward an inner side of the second recess 240. This may be intended to generate a restoring force that allows the second elastic member 240 to move back and then move forth when the installation of the second module 230 is complete while the second module 230 slides to be installed in the second recess. The second projection 243a is formed on an outer surface of the second elastic member 243. Thus, when the second module 230 is completed installed, the second module 230 is fixed to the second groove 231 formed at the side surface of the second module 230. Since the second elastic member 243 is formed to protrude as described above, the second elastic member 243 pushes the second projection 243a toward the second module 230. Thus, the second projection 243a does not easily fall out of the second groove 213. In this case, FIG. 11A shows surroundings of the second recess 240, and FIG. 11B is a cross sectional view taken along DD of FIG. 11A.

Figure 10A:
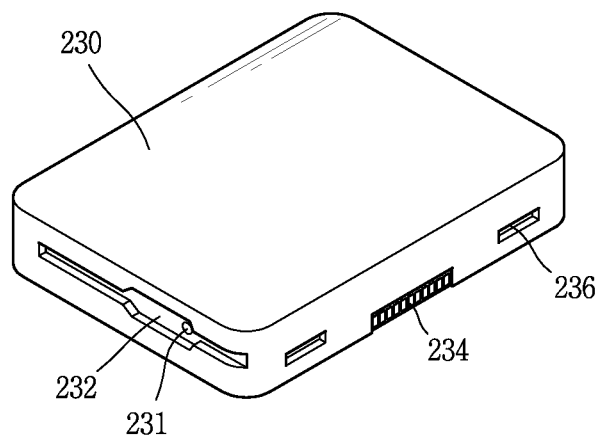
FIG. 10A is a perspective view of the second module according to an embodiment of the present invention.
Figure 10B:
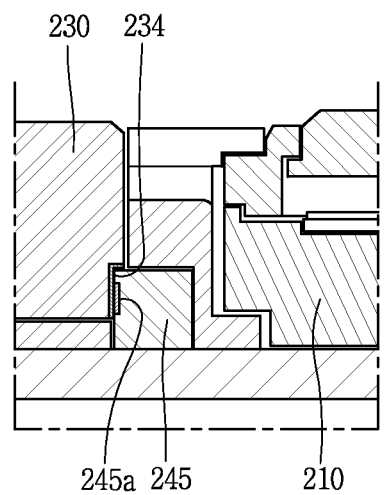
FIG. 10B is a cross sectional view taken along C-C of FIG. 3.

FIG. 10A is a perspective view of the second module 230 according to an embodiment of the present invention, and FIG. 10B is a cross sectional view taken along CC of FIG. 3.

As shown in FIG. 10, the second contact terminal 234 is formed on the front surface of the second module 230, and the second contact terminal 234 is electrically connected to the electrode 245a of the second connector 245. The second connector 245 may be a zebra connector. A plurality of electrodes are formed in the second connector 245 such that various second modules 230 may be utilized in contact with the plurality of electrodes. For example, as shown in FIG. 5, examples of the second module may include a camera module 230', a display module 230", a speaker module, and an optical mirror module and may further include a heart rate sensor module, an LDAF module, and a fingerprint recognition module. In order to replace and use such a plurality of modules, a plurality of utilizable electrodes should be secured. Accordingly, a zebra connector that may secure a plurality of electrodes in a narrow space is utilized in an embodiment of the present invention. This is the same in the case of the third connector 265 to be described below and the case of the first connector 225 described above. That is, like in the first connector 225, a plurality of electrodes 225a are formed in a plurality of regions R1, R2, R3, and R4, and respective electrodes formed in the regions R1, R2, R3, and R4 are coupled with different modules, thus enabling the plurality of modules to be replaced and used.

A third projection 246 is formed at one side of the second connector 245, and a third groove 236 is formed on the front surface of the second module 230 to accommodate the third projection 246. This is for preventing the second module 230 from moving in a length direction and a thickness direction of the mobile terminal 200.

Figure 12:
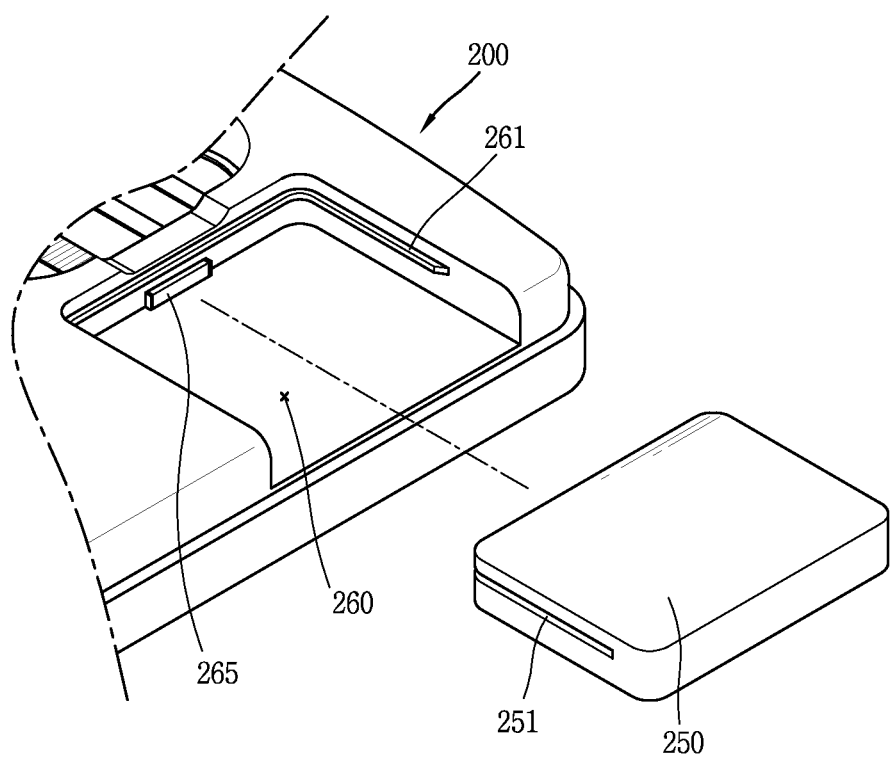
FIG. 12 shows the third module and the third recess according to an embodiment of the present invention.
Figure 13:
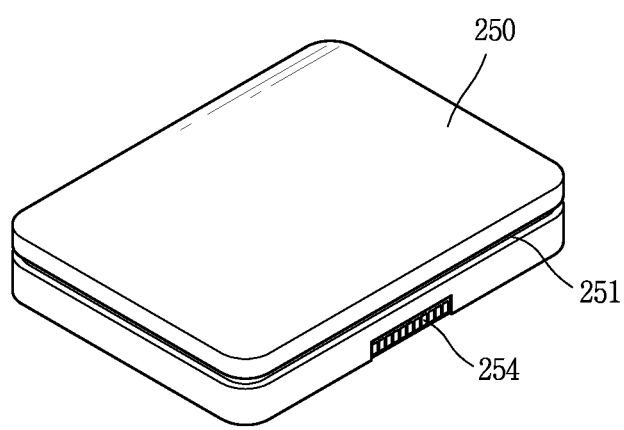
FIG. 13 is a perspective view of the third module according to an embodiment of the present invention.
Figure 14A:
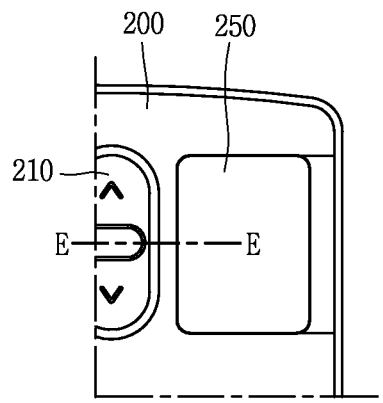
FIG. 14A shows a third module and a third recess according to an embodiment of the present invention.
Figure 14B:
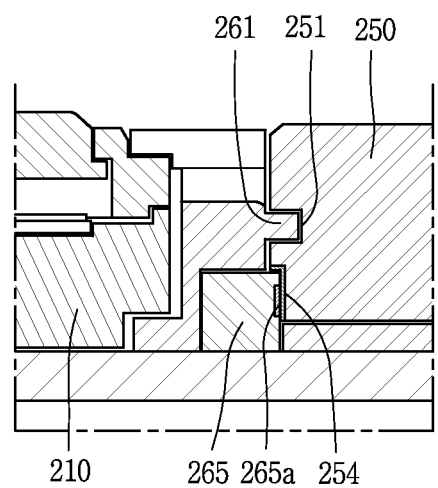
FIG. 14B is a cross sectional view taken along E-E of FIG. 14A.
Figure 15A:
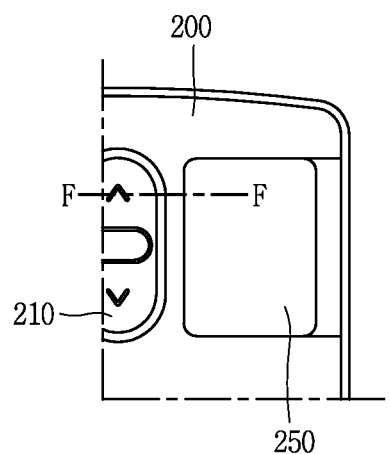
FIG. 15A shows a third module and a third recess according to an embodiment of the present invention.
Figure 15B:
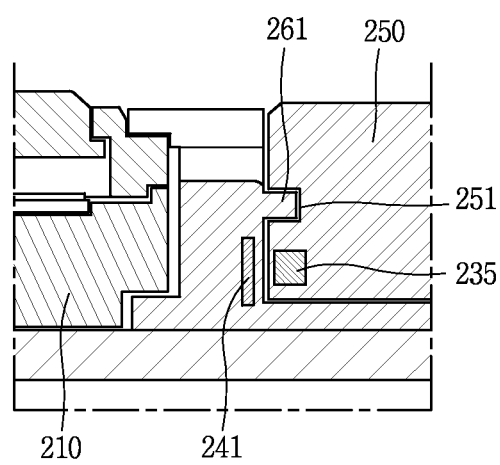
FIG. 15B is a cross sectional view taken along F-F of FIG. 15A.
Figure 16A:
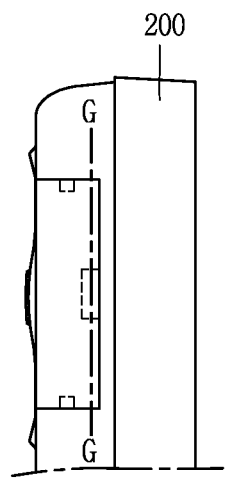
FIG. 16A shows a third module and a third recess according to an embodiment of the present invention.
Figure 16B:
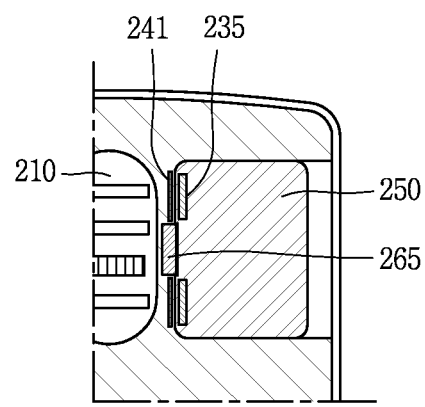
FIG. 16B is a cross sectional view taken along G-G of FIG. 16A.

FIG. 12 shows the third module 250 and the third recess 260 according to an embodiment of the present invention. FIG. 13 is a perspective view of the third module 250 according to an embodiment of the present invention. FIGS. 14 to 16 are cross sectional views of a state in which the third module 260 is installed in the third recess 260.

The structure of the third module 250 and the third recess 260 and a coupling method therefor will be described below with reference to FIGS. 12 to 16.

The third module 250 is disposed at a right side of the mobile terminal 200, and attached or detached by sliding from a side surface of the terminal body 204. A guide groove 251 is formed on a front surface and side surfaces of the third module 250. A second guide rail 261 is formed in the third recess 260 and configured to fix the third module 250. The guide groove 251 slides along the second guide rail 261.

In this case, the front surface of the third module 250 denotes a surface toward the third recess 260 when the third module 250 slides toward the third recess 260. A back surface of the third module 250 denotes a surface opposite to the front surface. A side surface of the third module 250 denotes a surface between the front surface and the back surface of the third module 250 and a surface that is not exposed to the outside when the third module 250 is installed.

In order to slide the third module 250, the guide groove 251 is formed on both side surfaces of the third module 250, and may also be formed on the front surface of the third module 250. In the third recess 260, the second guide rail 261 is formed corresponding to the guide groove 251, and the guide groove 251 slides along the second guide rail 261. In this case, the guide groove 251 is formed on the front surface of the third module 250 in order to prevent the third module 250 from moving in a thickness direction after the third module 250 is installed in the third mobile terminal 200.

In addition, in order to bind the third module 250 to the third recess 260, a second magnetic member 235 is disposed inside the third module 250, and a second metallic member 241 is disposed outside the third recess 260. The relevant matters are shown in FIGS. 15 and 16.

By using the second magnetic member 235 and the second metallic member 241 as described above, the third module 250 is prevented from separating from the third recess 260. This is merely an example, and it is obvious to those skilled in the art that magnetic members may be bound by a magnetic force, a magnetic member and a metallic member may be bound by a magnetic force, and their combination is allowed.

For example, the second magnetic member 235 may be formed inside the third module 250 and may also be formed outside the third recess 260, that is, inside the terminal body 204. In addition, when the second metal member 241 is formed inside the terminal body 204, the second magnetic member 235 may be disposed inside the third module 250.

Furthermore, as shown in FIGS. 13 and 14, the third contact terminal 254 is formed on the front surface of the third module 250, and the third connector 265 including a plurality of electrodes 265a is disposed in the third recess 260 to electrically connect the third contact terminal 254 and the printed circuit board 280.

The structure in which the first to third modules 210, 230, and 250 are installed in the first to third recesses 220, 240, and 260, respectively, has been described above. However, the installation structure is not limited to that described above. The first to third modules 210, 230, and 250 may be installed in the first to third recesses 220, 240, and 260 in various combinations. For example, a structure of the second elastic member 243, the second projection 243a, and the second groove 231, which is the coupling structure of the second module 230 and the recess 240, may be added to the coupling structure of the third module 250 and the third recess 260. Furthermore, a magnetic member and a metallic member may be used to install the second module 230 in the second recess 240.

An embodiment of the present invention provides a solution to enable the display unit to be combined as a front surface with a printed circuit board.

Figure 22:
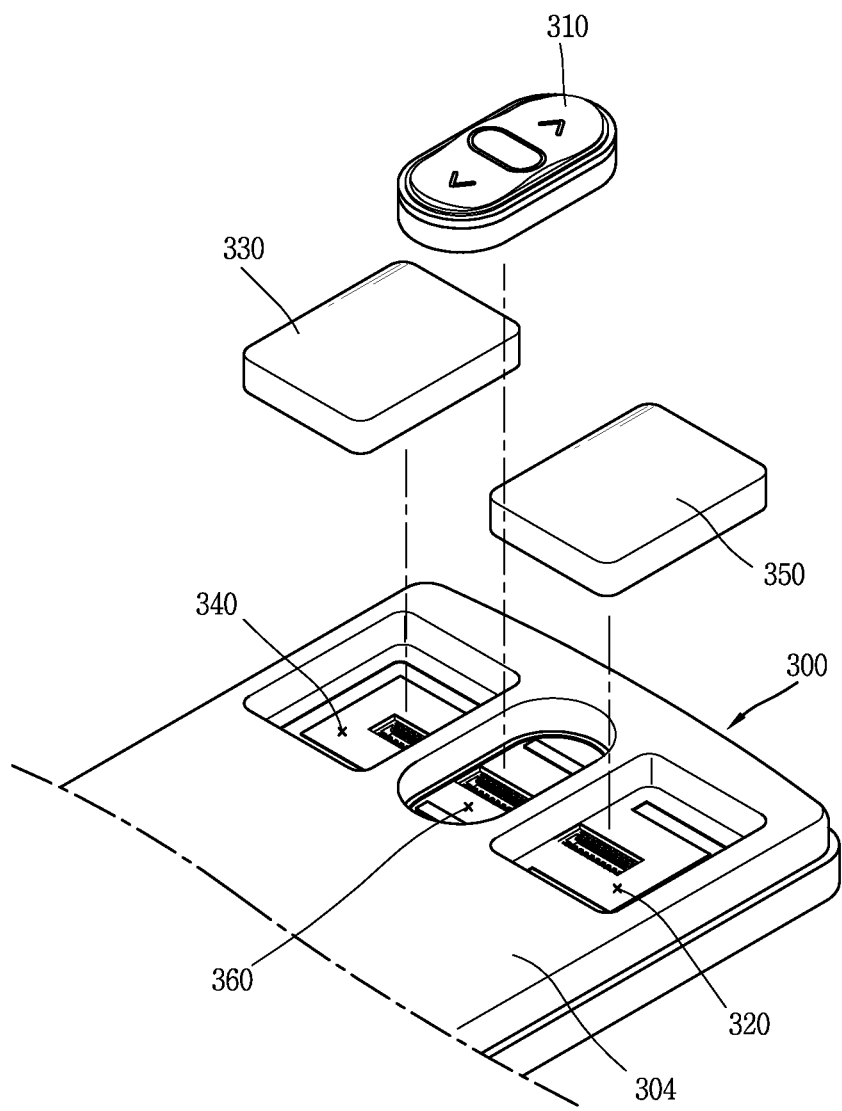
FIG. 22 is an exploded perspective view of a mobile terminal according to an embodiment of the present invention.
Figure 23:
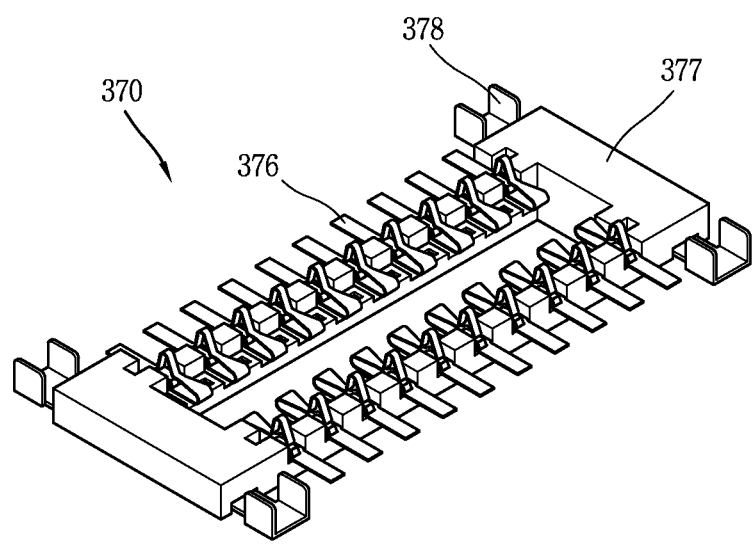
FIG. 23 is a perspective view of a pin module according to an embodiment of the present invention.
Figure 24:
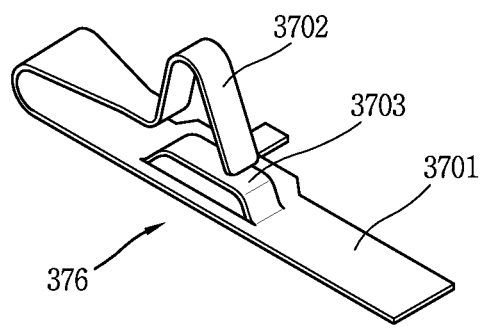
FIG. 24 is a perspective view of pins of a pin module of FIG. 23.
Figure 25A:
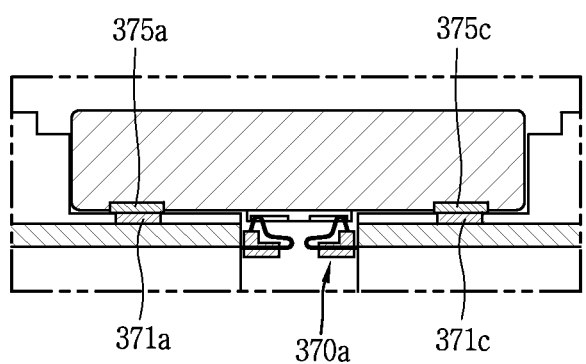
FIG. 25A shows a partial cross sectional view of a mobile terminal in which a pin module is utilized and FIG. 25B is a perspective view of a second module according to an embodiment of the present invention.
Figure 25B:
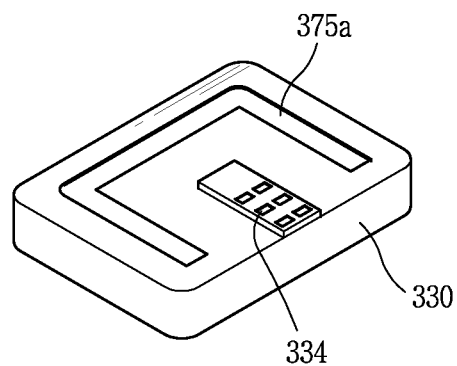

FIG. 22 is an exploded perspective view of a mobile terminal 300 according to an embodiment of the present invention. FIG. 23 is a perspective view of a pin module 370 according to an embodiment of the present invention. FIG. 24 is a perspective view of pins 376 of the pin module 370 of FIG. 23. In addition, FIG. 25 shows a partial cross sectional view of the mobile terminal 300 in which the pin module 300 is utilized and a perspective view of a second module 330.

The following description will be made with reference to FIGS. 22 to 25.

In the mobile terminal 300 according to an embodiment of the present invention, a first pin module 370a may be disposed on bottoms of the first to third recesses 320, 340, and 360, and first to third contact terminals 334 may be formed on bottoms of the first to third modules 310, 330, and 350 and electrically connected with the first pin module 370a. The first pin module 370a is a single module, and all of the first to third modules 310, 330, and 350 are electrically connected to the first pin module 370a.

It has been described that the second module 230 and the third module 250 are attached or detached by sliding from a side surface of the mobile terminal 200. In FIG. 22, however, the first to third modules 310, 330, and 350 are attached or detached in a thickness direction of the mobile terminal 300. To this end, third magnetic members 375a and 375c are included at bottoms of each of the first to third modules 310, 330, and 350, and third metallic members 371a and 371c are included in each of the first to third recesses 320, 340, and 360. In this case, it is appreciated that positions of the third magnetic members 375a and 375c may be exchanged with positions of the third metallic members 371a and 371c and the third magnetic members 375a and 375c may be used instead of the third metallic members 371a and 371c.

As shown in FIG. 23, the pin module 370 includes a plurality of pins 376 exposed through a first through hole 381 to be in contact with the first to third contact terminals, a pin body 377 in which the plurality of pins 376 are arranged, and a mounting part formed at both ends of the pin body 377 and mounted on the printed circuit board 380. The pin body 377 approximately has a shape of a rectangle. The plurality of pins 376 are arranged along a long side of the rectangle, and the mounting part 378 is disposed at a short side.

As shown in FIG. 24, each of the pins 376 includes a supporting part 3701 combined to the pin body 377 and configured to support the pin 376 and an elastic part 3702 extending from the supporting part 3701 and bent toward the supporting part 3701. A stopper 3703 is formed in the supporting part 3701 to protrude into the elastic part 3702. The stopper 3703 prevents the pin 376 from being short-circuited in a thickness direction of the mobile terminal 300.

In addition, as shown in FIG. 25, the first pin module 370a is electrically connected with the first to third contact terminal through the first through hole 381 formed in the printed circuit board 380. In this case, the third metallic members 371a and 371c are disposed in the printed circuit board 380 or the first to third recesses 310, 340, and 360 and the third magnetic members 375a and 375c are adhered to bottoms of the first to third modules 310, 330, and 350. Thus, the first to third modules 310, 330, and 150 are bound to the first to third recesses 320, 340, and 360. In addition, the first to third contact terminals 334 are formed on bottoms of the first to third modules 310, 330, and 350 and are in contact with the plurality of pins 376 of the pin module 370.

In this case, when the first pin module 370a is disposed at centers of the first to third recesses 320, 340, and 360, the third metallic member 371a and 371c and the third magnetic member 375a and 375c may be disposed in a region except for a region in which the first pin module 370a is disposed. For example, as shown in FIG. 25, the third magnetic members 375a and 375c disposed at bottoms of the second and third modules 330 and 350 and the corresponding third metallic members 371a and 371c disposed in the second and third recesses 340 and 360 are C-shaped.

Figure 26:
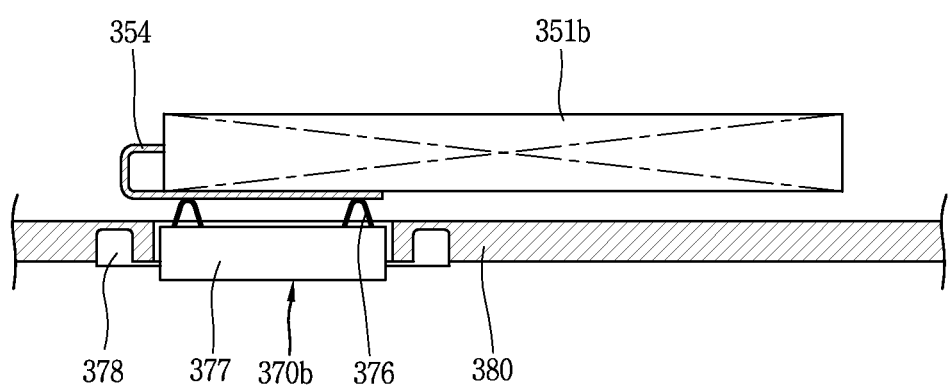
FIG. 26 is an exploded perspective view of a mobile terminal in which a pin module of FIG. 23 is utilized.
Figure 27:
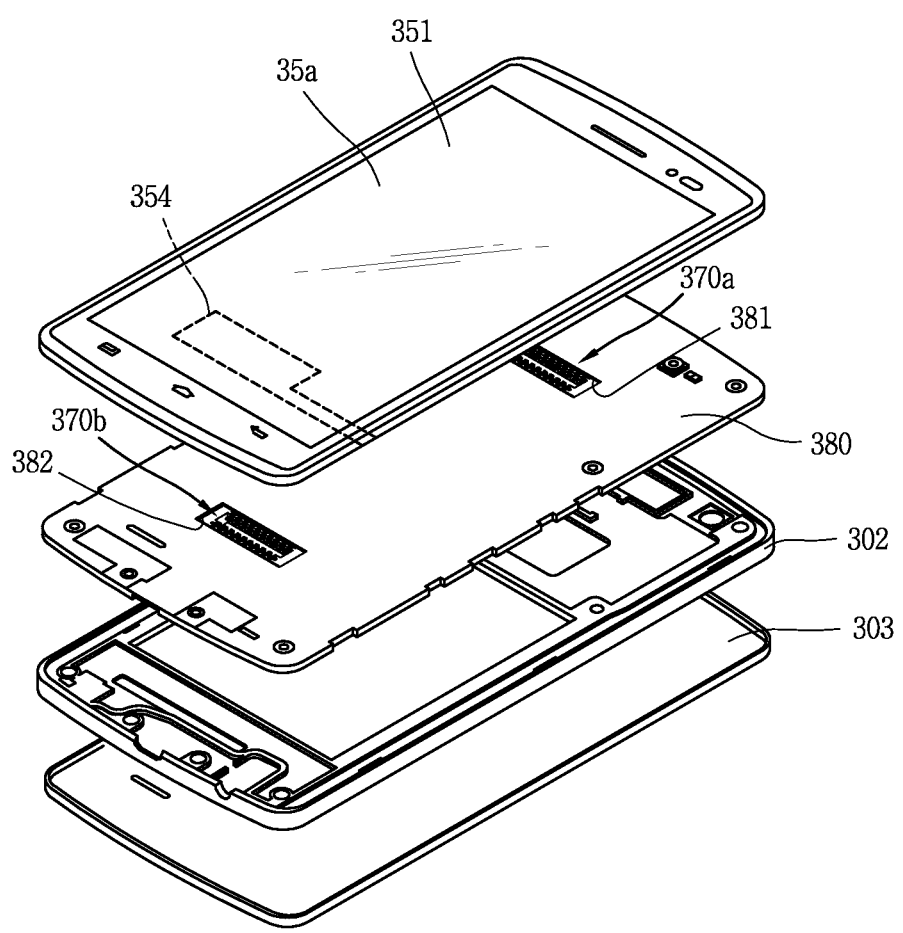
FIG. 27 is a cross sectional view of a display unit and a printed circuit board in which a pin module is utilized according to an embodiment of the present invention.

FIG. 26 is an exploded perspective view of the mobile terminal 300 in which the pin module 370 of FIG. 23 is utilized. FIG. 27 is a cross sectional view of a display unit 351 and a printed circuit board 380 in which the pin module 370 is utilized.

In an embodiment of the present invention, the display unit 351 may be combined as a front surface to the printed circuit board 380 by the pin module 370. That is, the mobile terminal 300 according to an embodiment of the present invention further includes a display unit 351 disposed on the terminal body 304 and including a window 351a and a second pin module 370b mounted on the printed circuit substrate 370 and having a plurality of pins 376 exposed through a second through hole 382 formed in the printed circuit board 380. The flexible printed circuit board 354 of the display unit 351 is electrically connected with the second pin module 370b.

The display may be combined with the printed circuit board 380 at a front side by bringing the second pin module 370b in direct contact with the flexible printed circuit board 354 of the display unit 351 through the printed circuit board 380 as described above.

Conventionally, the display unit 351 is assembled with a front case, and a rear case 302 is assembled with the front case. Next, the rear case 302 is fixed to the front case using screws. Accordingly, in order to connect the flexible printed circuit board 354 formed in the display unit 351 to a contact terminal formed on a back surface of the printed circuit board 380, the flexible printed circuit board 354 exposed to one side of the display unit 351 should be positioned to the back surface of the printed circuit board 380. However, according to an embodiment of the present invention, the flexible printed circuit board 354 is able to come in contact with a plurality of electrodes (pins 376) directly through the printed circuit board instead of along a long path.

Accordingly, the display unit 351, which is integrated by combining a window 351a and an LCD module 351b with an assembly of the rear case 302 and the printed circuit board 380, may be assembled in a direction of a front side.

More specifically with reference to FIG. 27, the flexible printed circuit board 354 connected to the LCD module 351b is disposed over the printed circuit board 380, the second through hole 382 is formed on the printed circuit board 380, and the pins 376 of the second pin module 370b are exposed through the second through hole 382. The LCD module 351b is driven by bringing contact terminals formed on the flexible printed circuit board 354 in contact with the pins 376. In this case, the pin module 370 is fixed to the printed circuit board 380 through the mounting part 378.

Figure 28:
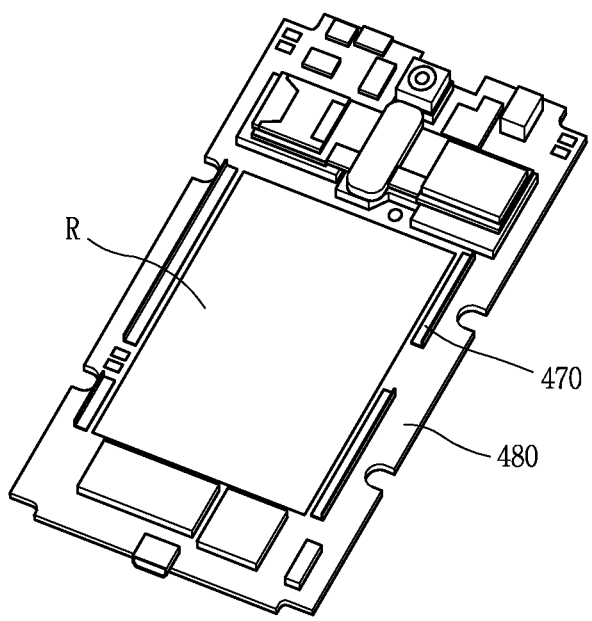
FIG. 28 is a cross sectional view of a mobile terminal according to an embodiment of the present invention.
Figure 29:
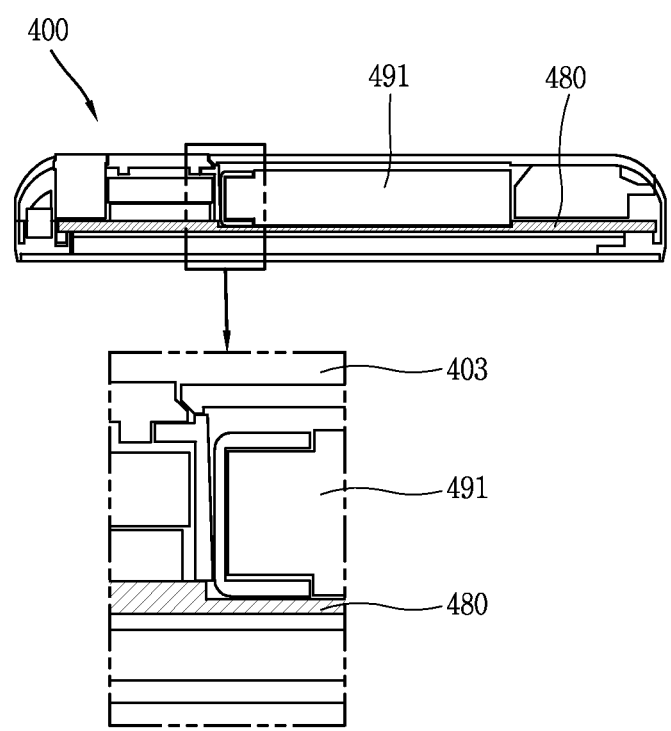
FIG. 29 is a perspective view of a printed circuit board according to an embodiment of the present invention.

FIG. 28 is a cross sectional view of a mobile terminal 400 according to an embodiment of the present invention. FIG. 29 is a perspective view of a printed circuit board 480 according to an embodiment of the present invention.

If the printed circuit board 480 is a one-board, the printed circuit board 480 is formed throughout the mobile terminal 400. A battery 491 is installed on a back surface of the printed circuit board A thickness of the mobile terminal 400 is increased due to a thickness of the battery 491. According to an embodiment of the present invention, in order to reduce the thickness of the mobile terminal 400, a region R of the printed circuit board in which the battery 491 is installed is recessed, and the battery 491 is disposed in the recessed region R.

By installing the battery 491 in the region R of the recessed printed circuit board 480 as described above, the mobile terminal 400 may be made slim. In this case, various kinds of electronic components are mound on upper and lower portions of the region R in which the battery 491 is disposed. A rib 470 is formed outside the recess region R in which the battery 491 may be disposed to increase rigidity reduced by processing the printed circuit board 480.

The effects of the mobile terminal and the control method thereof are as follows.

According to at least one of embodiments of the present invention, modules having various functions may be replaced according to a user's preference.

According to at least one of embodiments of the present invention, a display may be assembled at a front side, and also screws need not be used because of the pin module.

Furthermore, according to at least one of embodiments of the present invention, a thickness of a terminal may be reduced by forming a recessed region in a terminal body that uses a single substrate and positioning a battery in the recessed region.

Various embodiments may be implemented using a machine-readable medium having instructions stored thereon for execution by a processor to perform various methods presented herein. Examples of possible machine-readable mediums include HDD (Hard Disk Drive), SSD (Solid State Disk), SDD (Silicon Disk Drive), ROM, RAM, CD-ROM, a magnetic tape, a floppy disk, an optical data storage device, the other types of storage mediums presented herein, and combinations thereof. If desired, the machine-readable medium may be realized in the form of a carrier wave (for example, a transmission over the Internet). The processor may include the controller 180 of the mobile terminal.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A mobile terminal comprising:
 a terminal body;
 a first, second and third module detachable from a back surface of the terminal body; and
 a printed circuit board,
  wherein the back surface of the terminal body includes a first, second and third recess to receive the first, second and third module, respectively,
  wherein the second recess is located to one side of the first recess and the third recess is located to another side of the first recess,
  wherein the first module includes:
   a contact terminal configured to contact the printed circuit board through a connector having one or more electrode regions such that the first module is electrically connected to the printed circuit board when the first module is received in the first recess,
 a protrusion through a side surface of the first recess,
 a first button configured to receive a push input for a first function,
 a second button configured to receive a push input for a second function,
 a flexible printed circuit board including a plurality of contact terminals,
 a dome switch located between the flexible printed circuit board and the first and second buttons, the dome switch configured to transfer a push input received from the first button or the second button to at least one of the plurality of contact terminals such that the at least one contact terminal makes contact with the printed circuit board through the connector, wherein the terminal body further includes a cover configured for selectively covering the protrusion and maintaining the first module in the first recess when the cover is covering the protrusion.

2. The mobile terminal of claim 1, wherein the connector is disposed in the first recess.

3. The mobile terminal of claim 2, wherein the first module further comprises one or more magnetic members, and wherein one or more first metallic members are disposed in the first recess in locations corresponding to the one or more magnetic members when the first module is received in the first recess.

4. The mobile terminal of claim 1, wherein the cover includes an outer surface, and wherein the outer surface includes a plurality of slip-resistant formations.

5. The mobile terminal of claim 1 further comprising an elastic member associated with a side surface of the first recess, wherein the first module further comprises a side surface that includes a depression therein, wherein the elastic member comprises a surface facing the side surface of the first module when the first module is received in the first recess, the surface of the elastic member including a projection that aligns with and is received by the depression when the first module is received in the first recess.

6. The mobile terminal of claim 1, wherein the terminal body includes a concave detachment groove on opposite sides of the first recess.

7. The mobile terminal of claim 1, wherein the second module comprises a first side surface that includes a first groove-shaped guide, a second side surface that includes a second groove-shaped guide and a third side surface that includes a second contact terminal, wherein the second recess comprises a first side surface that includes a first guide rail and a second side surface that includes a second guide rail, the first groove-shaped guide configured to receive the first guide rail and the second groove-shaped guide configured to receive the second guide rail when the second module is slidably inserted into and received in the second recess, and wherein a second connector disposed in the second recess is configured to make contact with the second contact terminal when the second module is received in the second recess.

8. The mobile terminal of claim 7, wherein one of the side surfaces of the second recess further comprises an elastic member, the elastic member including a surface, with a projection thereon, that faces a corresponding one of the side surfaces of the second module when the second module is received in the second recess, and wherein the corresponding side surface of the second module further comprises a depression therein, and when the second module is received in the second recess, the projection on the surface of the elastic member aligns with and is received by the depression on the side surface of the second module.

9. The mobile terminal of claim 8, wherein the second recess further comprises a third side surface facing the third surface of the second module when the second module is received in the second recess, the third side of the second recess including a projection, and wherein the third side surface of the second module comprises a depression that aligns with and is configured to receive the projection on the third side surface of the second recess when the second module is received in the second recess.

10. The mobile terminal of claim 1, wherein the third module comprises a first, second and third side surface and a groove-shaped guide along the first, second and third side surfaces, wherein the third recess comprises a first, second and third side surface, each facing the first, second and third surface of the third module, respectively, when the third module is received in the third recess, wherein the third recess further comprises a guide rail along the first, second and third side surfaces of the third recess, and wherein the groove-shaped guide along the first, second and third side surfaces of the third module is configured to receive the guide rail along the first, second and third side surfaces of the third recess when the third module is slidably inserted into and received in the third recess.

11. The mobile terminal of claim 10, wherein the third module further comprises a third contact terminal on one of the first, second or third side surfaces of the third module, and wherein a third connector disposed in the third recess is configured to make contact with the third contact terminal when the third module is received in the third recess.

12. The mobile terminal of claim 11, wherein the third module further comprises a magnetic member, and wherein the third recess further comprises a metallic member disposed within one of the first, second or third side surfaces of the third recess, the magnetic member and the metallic member aligning with each other when the third module is received in the third recess.

13. The mobile terminal of claim 1 further comprising:
a display unit disposed on the terminal body; and
a pin module mounted on the printed circuit board having a plurality of pins exposed through an opening in the printed circuit board,
wherein the display unit comprises a flexible printed circuit board that is configured to make an electrical connection with the pin module.

14. The mobile terminal of claim 1 further comprising:
a battery, wherein the printed circuit board has a recess in which the battery is disposed.

15. The mobile terminal of claim 14, wherein electronic components are mounted on the printed circuit board above and below the battery.

16. The mobile terminal of claim 15, wherein a rib is disposed outside the recessed region in which the battery is disposed.

17. A mobile terminal comprising:
a terminal body including first, second and third recesses formed in a back surface of the terminal body;
first, second and third detachable modules, wherein the first, second and third recesses are configured to receive the first, second and third modules, respectively;
a printed circuit board;
a pin module mounted to the printed circuit board and exposed through a bottom surface of the first, second and third recesses,
wherein a first, second and third contact terminal is disposed on a bottom-facing surface of the first, second, and third modules, respectively, and
wherein each of the first, second and third contact terminals are configured to make an electrical connection with the pin module when the first, second and third modules are received in the first, second and third recesses, respectively, and wherein the pin module connects with the first, second and third contact terminals through an opening in the printed circuit board, and wherein the pin module comprises:

a plurality of pins, exposed through the opening in the printed circuit board, which come in contact with the first, second and third contact terminals;

a pin body on which the plurality pins are disposed; and a mounting part formed at both sides of the pin body and mounted on the printed circuit board.

18. The mobile terminal of claim 17, wherein each of the first, second and third modules are configured to be inserted into or removed from the first, second and third recesses, respectively, by moving the first, second and third modules in a direction perpendicular to the back surface of the terminal body, wherein the bottom-facing surface of each of the first, second, and third modules further comprises a magnetic member, and the bottom surface of each of the first, second and third recesses includes a metallic member, and wherein each magnetic member is configured to align with a corresponding one of the metallic members when the first, second and third modules are received in the first, second and third recesses.

* * * * *